(12) United States Patent
Takeda et al.

(10) Patent No.: US 9,178,059 B2
(45) Date of Patent: *Nov. 3, 2015

(54) SEMICONDUCTOR DEVICE

(71) Applicant: Renesas Electronics Corporation, Kawasaki-shi, Kanagawa (JP)

(72) Inventors: Hiroshi Takeda, Kanagawa (JP); Kiyoshi Takeuchi, Kanagawa (JP); Takashi Onizawa, Kanagawa (JP); Masayasu Tanaka, Kanagawa (JP)

(73) Assignee: Renesas Electronics Corporation, Tokyo (JP)

(*) Notice: Subject to any disclaimer, the term of this patent is extended or adjusted under 35 U.S.C. 154(b) by 86 days.

This patent is subject to a terminal disclaimer.

(21) Appl. No.: 14/037,552

(22) Filed: Sep. 26, 2013

(65) Prior Publication Data
US 2014/0084386 A1  Mar. 27, 2014

(30) Foreign Application Priority Data

Sep. 27, 2012 (JP) ................................ 2012-215138
Mar. 12, 2013 (JP) ................................ 2013-048879

(51) Int. Cl.
| H01L 29/78 | (2006.01) |
| H01L 29/872 | (2006.01) |
| H01L 29/66 | (2006.01) |

(Continued)

(52) U.S. Cl.
CPC ........ *H01L 29/7833* (2013.01); *H01L 27/0629* (2013.01); *H01L 29/0619* (2013.01); *H01L 29/0847* (2013.01); *H01L 29/66143* (2013.01); *H01L 29/66462* (2013.01); *H01L 29/66659* (2013.01); *H01L 29/7786* (2013.01); *H01L 29/7835* (2013.01); *H01L 29/872* (2013.01); *H01L 29/0634* (2013.01); *H01L 29/2003* (2013.01); *H01L 29/402* (2013.01);

(Continued)

(58) Field of Classification Search
CPC ..................................................... H01L 29/475
USPC ................................. 257/281, 282, 472, 473
See application file for complete search history.

(56) References Cited

U.S. PATENT DOCUMENTS 6,147,386 A    11/2000 Horiuchi
7,382,001 B2 * 6/2008 Beach ........................... 257/194

(Continued)

FOREIGN PATENT DOCUMENTS

| JP | 05-055553 A | 3/1993 |
| JP | 09-055439 A | 2/1997 |

(Continued)

OTHER PUBLICATIONS

Sankaran, S., et al., "A Ultra-Wideband Amplitude Modulation (AM) Detector Using Schottky Barrier Diodes Fabricated in Foundry CMOS Technology", IEEE Journal of Solid-State Circuits, vol. 42, No. 5, May 5, 2007, pp. 1058-1064.

*Primary Examiner* — Chandra Chaudhari
(74) *Attorney, Agent, or Firm* — Miles & Stockbridge P.C.

(57) ABSTRACT

A first contact, a second impurity region, and a second low-concentration impurity region form a Schottky barrier diode. The second impurity region has the same impurity concentration as those of first impurity regions, and thus can be formed in the same process as forming the first impurity regions. In addition, the second low-concentration impurity region has the same impurity concentration as those of first low-concentration impurity regions, and thus can be formed in the same process as forming the first low-concentration impurity regions.

20 Claims, 41 Drawing Sheets

(51) Int. Cl.
  *H01L 29/06* (2006.01)
  *H01L 29/08* (2006.01)
  *H01L 29/778* (2006.01)
  *H01L 27/06* (2006.01)
  *H01L 29/40* (2006.01)
  *H01L 29/45* (2006.01)
  *H01L 29/49* (2006.01)
  *H01L 29/20* (2006.01)
  *H01L 29/423* (2006.01)

(52) U.S. Cl.
  CPC ........... *H01L29/4236* (2013.01); *H01L 29/456* (2013.01); *H01L 29/4933* (2013.01)

(56) References Cited

U.S. PATENT DOCUMENTS 8,476,677 B2    7/2013  Machida et al.
8,766,276 B2 *  7/2014  Tanaka ........................ 257/76

FOREIGN PATENT DOCUMENTS

| JP | 10-028045 A   | 1/1998  |
| JP | 2005-175063   | 6/2005  |
| JP | 2010-147387   | 7/2010  |
| JP | 2011-243978 A | 12/2011 |

* cited by examiner

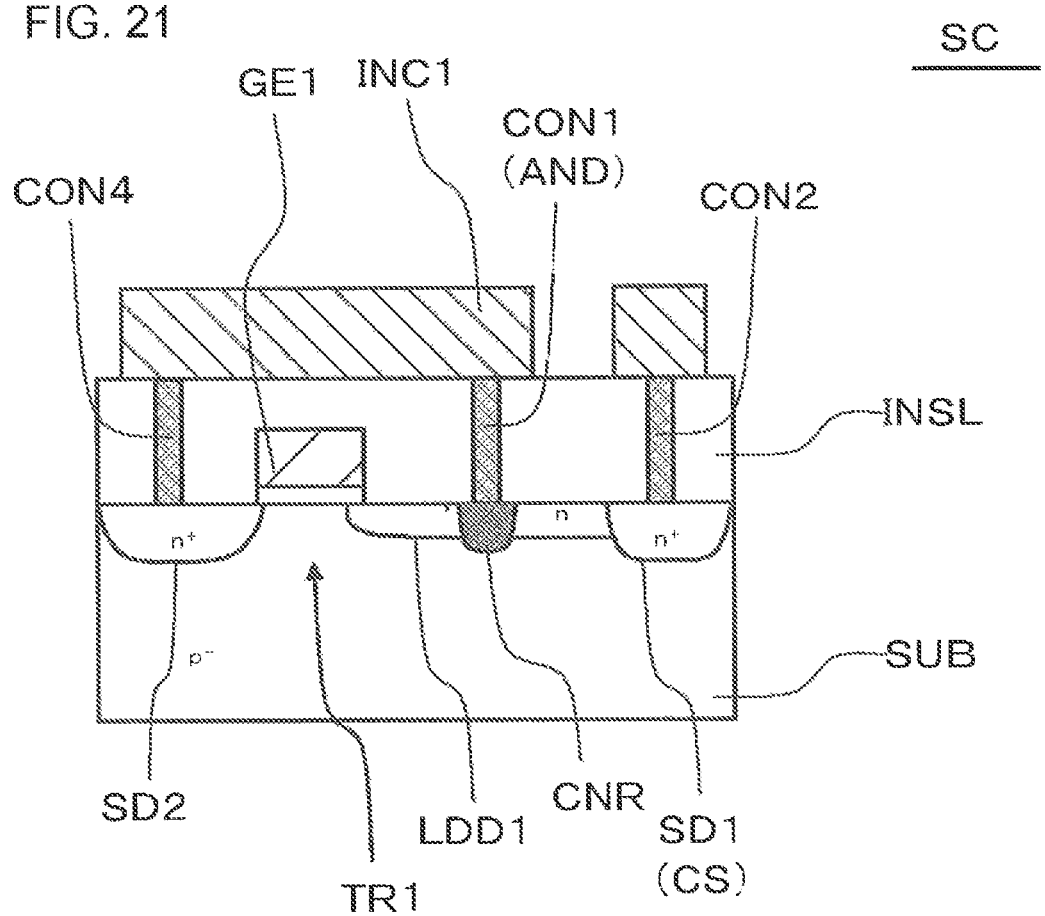

SEMICONDUCTOR DEVICE

This application is based on Japanese patent application Nos. 2012-215138 and 2013-048879, the contents of which are incorporated hereinto by reference.

BACKGROUND

1. Technical Field

The present invention relates to a semiconductor device, and to a technique applicable to, for example, a semiconductor device having a diode.

2. Related Art

Rectifying devices are often used in an electric circuit. In semiconductor devices, diodes such as a Schottky barrier diode are often used as rectifying devices.

Schottky barrier diodes formed using a semiconductor substrate include, for example, a diode disclosed in Japanese Unexamined Patent Publication No. H05-55553, A Schottky barrier diode disclosed in Japanese Unexamined Patent Publication No. H05-55553 is configured such that an n$^+$ region is formed in a portion of the surface layer of an n region, and an electrode is connected to each of the n$^+$ region and the n region. In Japanese Unexamined Patent Publication No. H05-55553, the Schottky barrier diode is formed together with a bipolar transistor. The n region of the Schottky barrier diode is formed to have the same depth as that of a well.

In addition, Japanese Unexamined Patent Publication No. H09-55439 and Japanese Unexamined Patent Publication No. H10-28045 disclose semiconductor devices in which a MOS transistor and a Schottky barrier diode are formed together. Particularly, Japanese Unexamined Patent Publication No. H09-55439 discloses that a silicide is used as a Schottky electrode. In addition, Japanese Unexamined Patent Publication No. H10-28045 discloses that an n region is caused to be adjacent to an n$^+$ region serving as a source or a drain of the MOS transistor, and that a Schottky electrode is connected to the n region.

In addition, Japanese Unexamined Patent Publication No. 2010-147387 and Japanese Unexamined Patent Publication No. 2011-243978 disclose that in compound semiconductor devices using two-dimensional electron gas, a Schottky electrode is provided in a region which is located between a gate electrode and drain in an electron supply layer, and that the Schottky electrode is electrically connected to a source.

Further, a non-patent document (S. Snakaran et al., J. Solid-State Circuit, 42, P. 1058, 2007) discloses that an element isolation film is located between two electrodes of a Schottky barrier diode.

Meanwhile, Japanese Unexamined Patent Publication No. 2005-175063 discloses that in a transistor including an n-type drift region, the transistor has a high withstanding voltage by providing a p-type impurity layer in the surface layer of a drift region.

SUMMARY

One characteristic required for a Schottky barrier diode is its low on-resistance. The inventor has examined a reduction in the on-resistance without increasing the number of manufacturing processes in the Schottky barrier diode formed together with a MOS transistor.

In addition, the inventor has considered that in the method disclosed in Japanese Unexamined Patent Publication No. 2010-147387 and Japanese Unexamined Patent Publication No. 2011-243978, a depletion layer is formed between a drain and a channel due to the Schottky electrode, to thereby cause the on-resistance of a transistor to be increased.

Other problems and novel features will be made clearer from the description and the accompanying drawings of the present specification.

In one embodiment, a first impurity region of a first conductivity type, a first low-concentration impurity region of a first conductivity type, a second impurity region of a first conductivity type, a second low-concentration impurity region of a first conductivity type, a first contact, and a second contact are formed in a substrate. The first impurity region is a source and a drain of a transistor, and the first low-concentration impurity region is an LDD region of the transistor. The second impurity region has the same impurity concentration as that of the first impurity region. The second low-concentration impurity region is connected to the second impurity region, and has the same impurity concentration as that of the first low-concentration impurity region. The first contact is connected to the second impurity region, and the second contact is connected to the second low-concentration impurity region. When seen in a plan view, an element isolation film is not formed between the first contact and the second contact.

In another embodiment, a gate electrode, a source region, a drain region, and a low-concentration impurity region are formed in a substrate. The low-concentration impurity region is located between the gate electrode and the drain region when seen in a plan view. A first contact is connected to the low-concentration impurity region. The first contact is electrically connected to the source region. A junction region is formed in a portion which is connected to the first contact in the low-concentration impurity region. The junction region has a higher carrier concentration than that of the low-concentration impurity region, and has a lower carrier concentration than that of the drain region.

In another embodiment, a gate electrode, a source region, a drain region, and a low-concentration impurity region are formed in a substrate. The low-concentration impurity region is located between the gate electrode and the drain region when seen in a plan view. A first contact is connected to the low-concentration impurity region. The first contact is electrically connected to the source region. A junction region is formed in a portion which is connected to the first contact in the low-concentration impurity region. When an impurity concentration of the junction region is set to $N_d$, a depth of the junction region is set to $\sigma_d$, an impurity concentration of the low-concentration impurity region is set to $N_{LDD}$, and a depth of the junction region is set to $\sigma_{LDD}$, the following Expression (1) is satisfied.

$$N_d > N_{LDD} \cdot \sigma_{LDD}^2 / \sigma_d^2 \qquad (1)$$

In another embodiment, a gate electrode, a source region, a drain region, and a junction region are formed in a nitride semiconductor layer. The junction region is located between the gate electrode and the drain region when seen in a plan view. An impurity is introduced into the junction region, and a first contact is connected to the junction region. The first contact is electrically connected to the source region.

According to the above-mentioned embodiments, it is possible to reduce an on-resistance without increasing the number of manufacturing processes in a Schottky barrier diode formed together with a MOS transistor.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 21 is a cross-sectional view illustrating a configuration of a semiconductor device according to an eighth embodiment.

DETAILED DESCRIPTION

Figure 1:
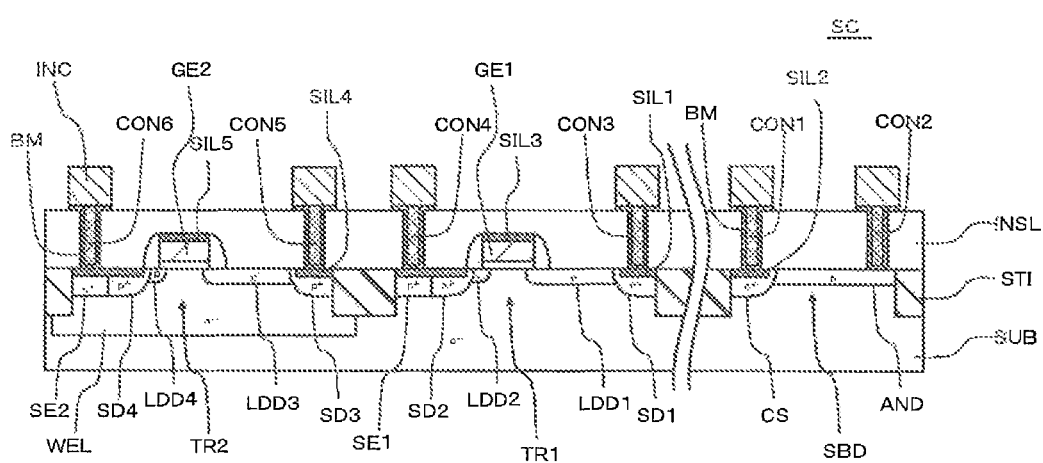
FIG. 1 is a cross-sectional view illustrating a configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

First Embodiment

FIG. 1 is a cross-sectional view illustrating a configuration of a semiconductor device SC according to a first embodiment. The semiconductor device SC includes a substrate SUB, first impurity regions SD1 and SD2, first low-concentration impurity regions LDD1 and LDD2, a second impurity region CS, a second low-concentration impurity region AND, a first contact CON1, and a second contact CON2. The first impurity regions SD1 and SD2, the first low-concentration impurity regions LDD1 and LDD2, the second impurity region CS, and the second low-concentration impurity region AND are all formed in the substrate SUB, and are first conductivity types. The substrate SUB is, for example, a semiconductor substrate such as a silicon substrate. The first impurity regions SD1 and SD2 are a source and a drain of a first transistor TR1. The first low-concentration impurity regions LDD1 and LDD2 are lightly doped drain (LDD) regions of the first transistor TR1. The second impurity region CS are isolated from the first impurity regions SD1 and SD2 by an element isolation film STI, and has the same impurity concentration (impurity profile in a depth direction) as that of the first impurity regions SD1 and SD2. The second low-concentration impurity region AND is connected to the second impurity region CS, and has the same impurity concentration (impurity profile in a depth direction) as that of the first low-concentration impurity regions LDD1 and LDD2. The first contact CON1 is ohmic-connected to the second impurity region CS, and the second contact CON2 is connected to the second low-concentration impurity region AND. When seen in a plan view, the element isolation film STI is not formed between the first contact CON1 and the second contact CON2.

The first contact CON1, the second impurity region CS, and the second low-concentration impurity region AND form a Schottky barrier diode SBD. The second impurity region CS has the same impurity concentration as that of the first impurity regions SD1 and SD2, and thus can be formed in the same process as forming the first impurity regions SD1 and SD2. In addition, the second low-concentration impurity region AND has the same impurity concentration as that of the first low-concentration impurity regions LDD1 and LDD2, and thus can be formed in the same process as forming the first low-concentration impurity regions LDD1 and LDD2. For this reason, it is not necessary to increase the number of processes for the purpose of forming the Schottky barrier diode SBD.

In addition, when seen in a plan view, the element isolation film STI is not formed between the first contact CON1 and the second contact CON2. For this reason, the length of a current path from the first contact CON1 to the second contact CON2 (that is, the length of the second low-concentration impurity region AND) is shortened. Therefore, the on-resistance of the Schottky barrier diode SBD is reduced.

Hereinafter, a detailed description will be given. Meanwhile, in the following description, the first conductivity type is an n-type. However, the first conductivity type may be a p-type.

The substrate SUB is, for example, a p-type silicon substrate. The element isolation film STI is formed in the substrate SUB. The element isolation film STI is formed, for example, by an STI method.

The first transistor TR1 and a second transistor TR2 are formed in the substrate SUB. The first transistor TR1 is an n-type MOS transistor, and the second transistor TR2 is a p-type MOS transistor. The first transistor TR1 and the second transistor TR2 constitute a complementary metal oxide semiconductor (CMOS).

A first transistor TR1 includes the $n^+$ first impurity region SD1 as a drain, and includes the $n^+$ first impurity region SD2 as a source. The first transistor TR1 further includes the first low-concentration impurity regions LDD1 and LDD2. The first low-concentration impurity region LDD1 is located between a gate electrode GE1 and the first impurity region SD1 of the first transistor TR1 when seen in a plan view, and the first low-concentration impurity region LDD2 is located between the gate electrode GE1 and the first impurity region SD2 when seen in a plan view. In the example shown in the drawing, the first low-concentration impurity region LDD1 is longer than the first low-concentration impurity region LDD2. However, the first low-concentration impurity region LDD1 may have the same length as that of the first low-concentration impurity region LDD2.

The second transistor TR2 is formed in an $n^-$ well WEL. The second transistor TR2 includes a $p^+$ third impurity region SD3 as a drain, and includes an $n^+$ third impurity region SD4 as a source. The second transistor TR2 further includes third low-concentration impurity regions LDD3 and LDD4. The third low-concentration impurity region LDD3 is located between a gate electrode GE2 and the third impurity region SD3 of the second transistor TR2 when seen in a plan view, and the third low-concentration impurity region LDD4 is located between the gate electrode GE2 and the third impurity region SD4 when seen in a plan view. In the example shown in the drawing, the third low-concentration impurity region LDD3 is longer than the third low-concentration impurity region LDD4. However, the third low-concentration impurity region LDD3 may have the same length as that of the third low-concentration impurity region LDD4.

In addition, a first silicide layer SIL1 is formed in the surface layers of the first impurity regions SD1 and SD2, and a silicide layer SIL4 is formed in the surface layers of the third impurity regions SD3 and SD4. Further, a silicide layer SIL3 is formed in the surface layer of the gate electrode GE1, and a silicide layer SIL5 is formed in the surface layer of the gate electrode GE2. These silicides are, for example, TiSi, CoSi, NiSi, NiPtSi, or PtSi.

The Schottky barrier diode SBD is isolated from the first transistor TR1 and the second transistor TR2 by the element isolation film STI. The second impurity region CS includes a second silicide layer SIL2 in the surface layer. The second silicide layer SIL2 is a silicide made of the same metal as the first silicide layer SIL1. For this reason, the second silicide layer SIL2 can be formed in the same process as forming the first silicide layer SIL1.

The second low-concentration impurity region AND is formed in the surface layer of the substrate SUB. The silicide layer is not formed in the surface layer of the second low-concentration impurity region AND.

An insulating interlayer INSL is formed on the substrate SUB. The first contact CON1, the second contact CON2, and contacts CON3 to 6 are embedded in the insulating interlayer INSL. These contacts are configured such that the bottoms and the lateral sides thereof are covered by a barrier metal BM. The barrier metal BM is, for example, a film in which a Ti layer and a TiN layer are laminated in this order. In addition, the first contact CON1, the second contact CON2, and the contacts CON3 to 6 are connected to interconnects INC different from each other. The interconnect INC may be formed on the insulating interlayer INSL, and may be embedded in the surface layer of the insulating interlayer INSL. Meanwhile, at least two interconnects INC shown in FIG. 1 may be regions different from each other in one interconnect.

The first contact CON1 is connected to the second silicide layer SIL2 through the barrier metal BM. The second silicide layer SIL2 is formed, and thus the connection resistance between the first contact CON1 and the second impurity region CS is reduced.

The second contact CON2 is connected to the second low-concentration impurity region AND through the barrier metal BM. For this reason, the Schottky metal of the Schottky barrier diode SBD serves as the barrier metal BM. That is, according to such a structure, a process aimed at forming the Schottky metal may not be added.

In addition, the contact CON3 is connected to the first silicide layer SIL1 on the first impurity region SD1, and the contact CON4 is connected to the first silicide layer SIL1 on the first impurity region SD2. The contact CON5 is connected to the silicide layer SIL4 on the third impurity region SD3, and the contact CON6 is connected to the silicide layer SIL4 on the third impurity region SD4.

Meanwhile, a reference potential is applied to the substrate SUB through the $p^+$ impurity region SE1. The impurity region SE1 is connected to the first impurity region SD2. The first silicide layer SIL1 located on the first impurity region SD2 extends up to the upper portion of the impurity region SE1. According to such a structure, the substrate SUB is connected to the contact CON4 through the impurity region SE1 and the first silicide layer SIL1.

In addition, a reference potential is applied to the well WEL through the $n^+$ impurity region SE2. The impurity region SE2 is connected to the third impurity region SD4. The silicide layer SIL4 located on the third impurity region SD4 extends up to the upper portion of the impurity region 5E2. According to such a structure, the well WEL is connected to the contact CON6 through the impurity region SE2 and the silicide layer SIL4.

Figure 2:
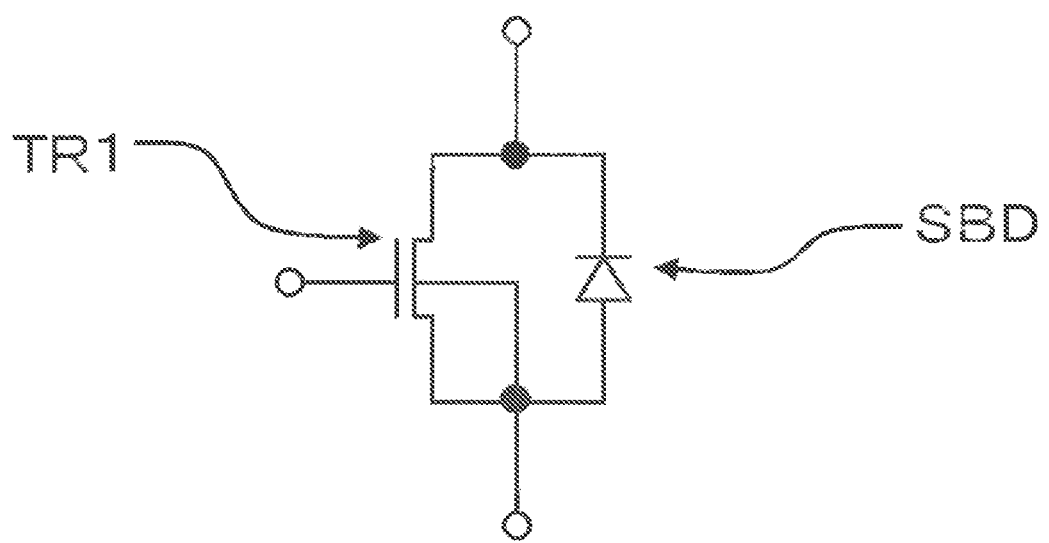
FIG. 2 is a circuit diagram illustrating an example of usage of a Schottky barrier diode.

FIG. 2 is a circuit diagram illustrating an example of usage of the Schottky barrier diode SBD. In the example shown in the drawing, the Schottky barrier diode SBD is used as a protection element of the first transistor TR1. Specifically, the Schottky barrier diode SBD is connected to the first transistor TR1 in the reverse direction. In this case, the first contact CON1 (shown in FIG. 1) is connected to the contact CON3 (shown in FIG. 1), and the second contact CON2 (shown in FIG. 1) is connected to the contact CON4 (shown in FIG. 1).

Figure 3:
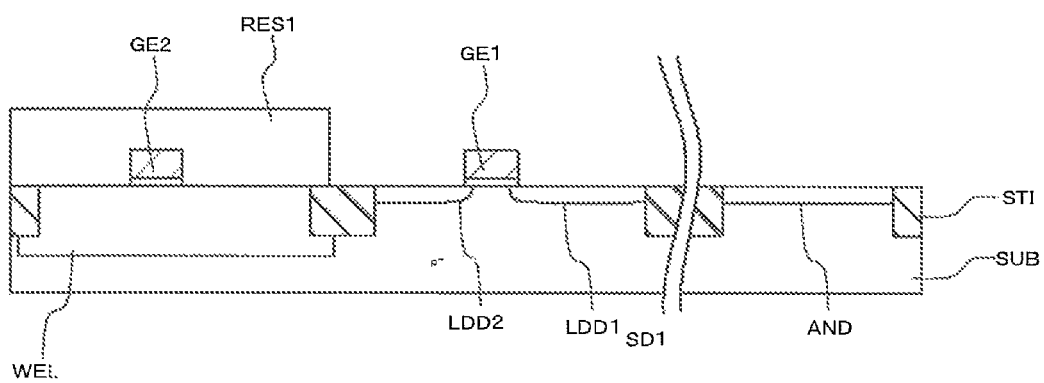
FIG. 3 is a cross-sectional view illustrating an example of a method for manufacturing the semiconductor device shown in FIG. 1.
Figure 4:
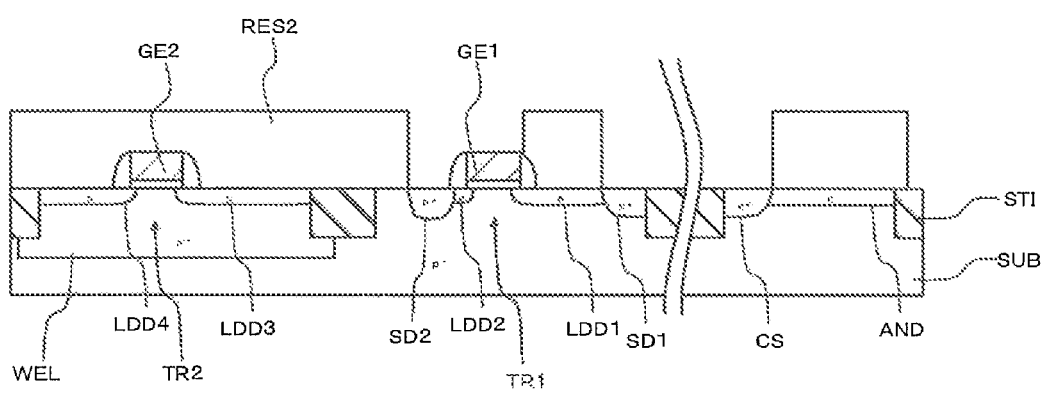
FIG. 4 is a cross-sectional view illustrating an example of the method for manufacturing the semiconductor device shown in FIG. 1.
Figure 5:
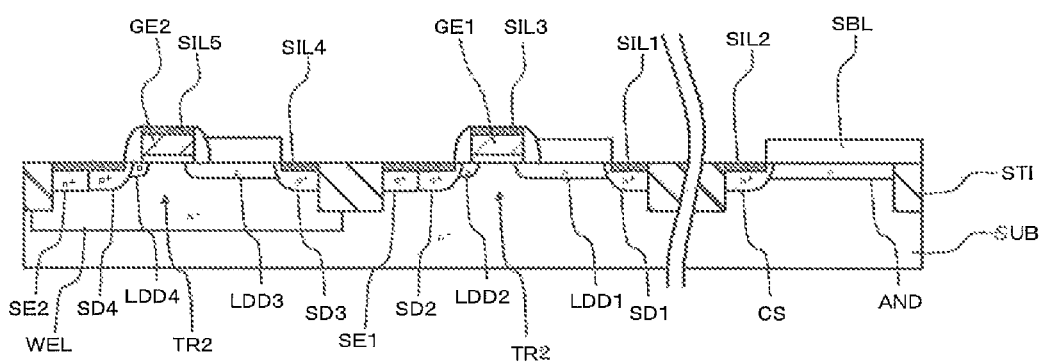
FIG. 5 is a cross-sectional view illustrating an example of the method for manufacturing the semiconductor device shown in FIG. 1.

FIGS. 3 to 5 are cross-sectional views illustrating an example of a method for manufacturing the semiconductor device SC shown in FIG. 1. First, as shown in FIG. 3, the well WEL and the element isolation film STI are formed in the substrate SUB. Either the well WEL or the element isolation film STI may be formed in advance. Next, a gate insulating film and the gate electrode GET of the first transistor TR1 and a gate insulating film and the gate electrode GE2 of the second transistor TR2 are formed on the substrate SUB. Next, a resist pattern RES1 is formed. The resist pattern RES1 covers a region in which the second transistor TR2 is formed in the substrate SUB. Next, an n-type impurity is ion-implanted into the substrate SUB using the resist pattern RES1, the gate electrode GE1, and the element isolation film STI1 as a mask. Thereby, the first low-concentration impurity regions LDD1 and LDD2, and the second low-concentration impurity region AND are formed in the substrate SUB.

Thereafter, the resist pattern RES1 is removed. Next, a resist pattern (not shown) is formed on the substrate SUB. This resist pattern covers a region in which the first transistor TR1 and the Schottky barrier diode SBD are formed in the substrate SUB. Next, a p-type impurity is ion-implanted using the resist pattern, the element isolation film STI, and the gate electrode GE2 as a mask. Thereby, the third low-concentration impurity regions LDD3 and LDD4 are formed in the substrate SUB. Thereafter, the resist pattern is removed.

Next, as shown in FIG. 4, sidewalls are formed at the lateral sides of the gate electrode GE1 and the gate electrode GE2. Next, a resist pattern RES2 is formed. The resist pattern RES2 covers a region in which the second transistor TR2 is formed in the substrate SUB, a region in which the impurity region SE1 is formed, a region which is left in the first low-concentration impurity region LDD1, and a region which is left in the second low-concentration impurity region AND. Next, an n-type impurity is ion-implanted into the substrate SUB using the resist pattern RES2, the gate electrode GE1, the sidewall, and the element isolation film STI as a mask. Thereby, the first impurity regions SD1 and SD2, and the second impurity region CS are formed in the substrate SUB.

Thereafter, the resist pattern RES2 is removed. Next, a resist pattern (not shown) is formed on the substrate SUB. This resist pattern covers a region in which the first transistor TR1 and the Schottky barrier diode SBD are formed in the substrate SUB, and a region in which the impurity region SE2 is formed. Next, a p-type impurity is ion-implanted using the resist pattern, the element isolation film STI, the sidewall, and the gate electrode GE2 as a mask. Thereby, the third low-concentration impurity regions LDD3 and LDD4 are formed in the substrate SUB. Thereafter, the resist pattern is removed.

Next, as shown in FIG. 5, the third low-concentration impurity region LDD3, the first low-concentration impurity region LDD1, and the second low-concentration impurity region AND are covered with an insulating film SBL. The insulating film SBL is, for example, a silicon oxide, or a silicon nitride, and is used as a silicide block film. Next, a metal film, for example, a Ni film or a Co film is formed on the insulating film SBL, the substrate SUB, the gate electrode GE1, the gate electrode GE2, and the element isolation film STI. Next, the metal film and the substrate SUB is heat-treated. Thereby, the first silicide layer SIL1, the second silicide layer SIL2, and the silicide layers SIL3 to 5 are formed. Next, the metal film which is not made into silicide is removed.

Thereafter, the insulating interlayer INSL is formed. Next, a mask pattern (not shown) is formed on the insulating interlayer INSL, and the insulating interlayer INSL is etched using the mask pattern as a mask. Thereby, a plurality of through-holes for embedding the contacts are formed in the insulating Interlayer INSL. Next, conductors are embedded within these through-holes. Thereby, the first contact CON1, the second contact CON2, and the contacts CON3 to 6 are formed. Next, the interconnect INC is formed. Meanwhile, each contact and each interconnect may be formed by a damascene method.

As stated above, according to the embodiment, the second impurity region CS is formed in the same process as forming the first impurity regions SD1 and SD2. In addition, the second low-concentration impurity region AND is formed in the same process as forming the first low-concentration impurity regions LDD1 and LDD2. For this reason, it is not necessary to increase the number of processes for the purpose of forming the Schottky barrier diode SBD. In addition, when seen in a plan view, the element isolation film STI is not formed between the first contact CON1 and the second contact CON2. For this reason, the length of a current path from the first contact CON1 to the second contact CON2 (that is, the length of the second low-concentration impurity region AND) is shortened. Therefore, the on-resistance of the Schottky barrier diode SBD is reduced.

Second Embodiment

Figure 6:
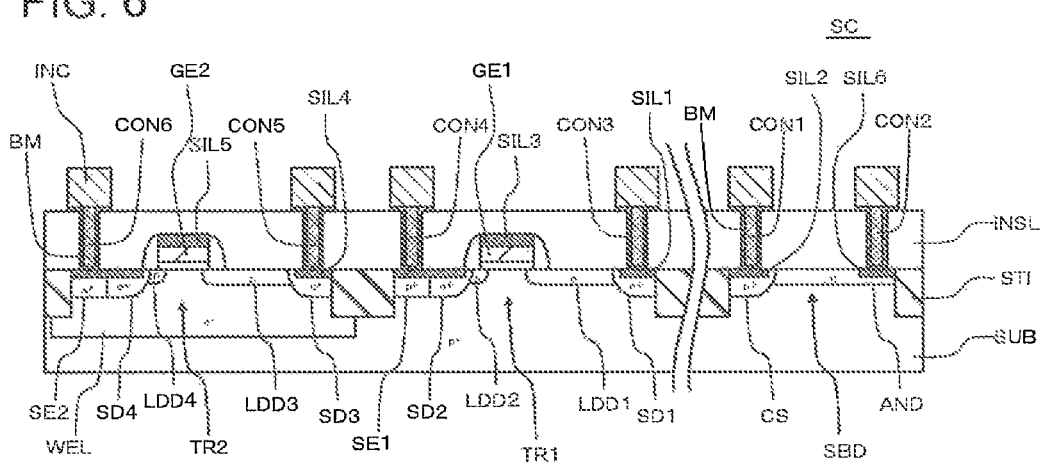
FIG. 6 is a cross-sectional view illustrating a configuration of a semiconductor device according to a second embodiment.

FIG. 6 is a cross-sectional view illustrating a configuration of a semiconductor device SC according to a second embodiment. The semiconductor device SC according to the embodiment has the same configuration as that of the semiconductor device SC according to the first embodiment, except that a silicide layer SIL6 (third silicide layer) is included.

The silicide layer SIL6 is formed in a region to which the second contact CON2 is connected in the second low-concentration impurity region AND. The second contact CON2 is connected to the second low-concentration impurity region AND through the barrier metal BM and the silicide layer SIL6. In this case, the Schottky metal of the Schottky barrier diode SBD serves as the silicide layer SIL6.

Meanwhile, a method for manufacturing the semiconductor device SC according to the embodiment is the same as the method for manufacturing the semiconductor device SC according to the first embodiment, except for the pattern of the insulating film SBL.

In the embodiment, it is also possible to obtain the same effect as that in the first embodiment. In addition, since at least a portion of the lateral side of the silicide layer SIL6 comes into contact with the second low-concentration impurity region AND, the area of a Schottky junction increases. Therefore, it is possible to reduce the on-resistance of the Schottky barrier diode SBD.

Third Embodiment

Figure 7:
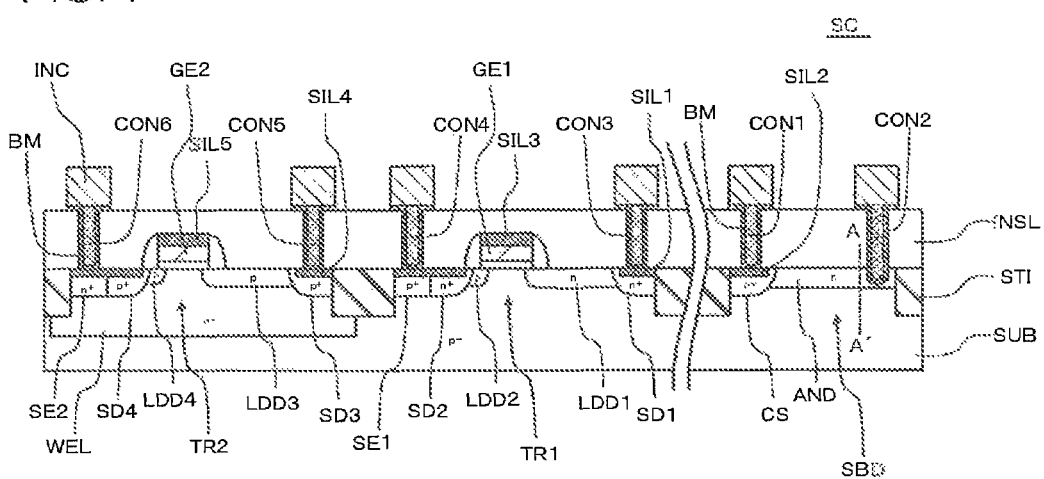
FIG. 7 is a cross-sectional view illustrating a configuration of a semiconductor device according to a third embodiment.

FIG. 7 is a cross-sectional view illustrating a configuration of a semiconductor device SC according to a third embodiment. The semiconductor device SC according to the embodiment has the same configuration as that of the semiconductor device SC according to the first embodiment, except that the leading end of the second contact CON2 gains entrance to a region in which the second low-concentration impurity region AND is formed in the substrate SUB. In the example shown in the drawing, the leading end of the second contact CON2 is rounded, and has no corner.

A method for manufacturing the semiconductor device SC according to the embodiment is the same as the method for manufacturing the semiconductor device SC according to the first embodiment, except for etching conditions when a through-hole is formed in the insulating interlayer INSL. In the embodiment, when the through-hole is formed in the insulating interlayer INSL, at least the last etching condition becomes a condition in which Si is etched more easily than silicide. Thereby, the leading end of the through-hole for embedding the second contact CON2 gains entrance to the region in which the second low-concentration impurity region AND is formed in the substrate SUB.

Figure 8:
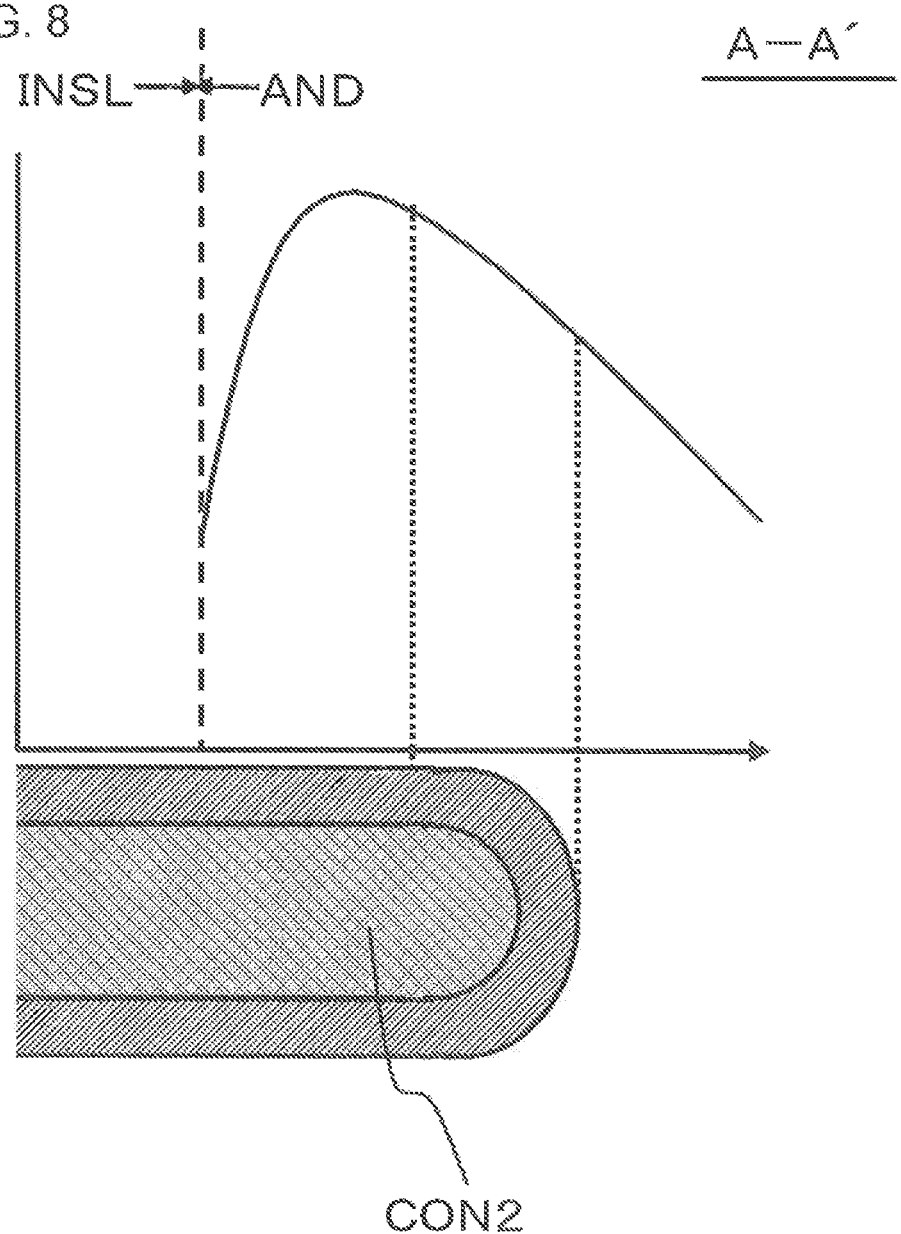
FIG. 8 is a diagram illustrating a concentration profile of a second low-concentration impurity region in a depth direction.

FIG. 8 is a diagram illustrating a concentration profile of the second low-concentration impurity region AND in a depth direction. As shown in the drawing, in the depth direction, a region overlapping the leading end of the second contact CON2 in the second low-concentration impurity region AND includes a region in which the impurity concentration decreases as the depth thereof increases. In the example shown in the drawing, in the second low-concentration impurity region AND, the entirety of a region overlapping a rounded portion in the leading end of the second contact CON2 in the depth direction has a decreasing impurity concentration as the depth thereof increases.

In the embodiment, it is also possible to obtain the same effect as that in the first embodiment. In addition, since the leading end of the second contact CON2 gains entrance to the second low-concentration impurity region AND, the area of a Schottky junction of the Schottky barrier diode SBD increases. Therefore, it is possible to reduce the on-resistance of the Schottky barrier diode SBD.

In addition, the region overlapping the leading end of the second contact CON2 in the second low-concentration impurity region AND has a decreasing impurity concentration as the depth thereof increases. For this reason, it is possible to suppress the concentration of an electric field on the leading end of the second contact CON2.

In addition, the leading end of the second contact CON2 is rounded. For this reason, an electric field is not likely to be concentrated on a specific portion of the leading end of the second contact CON2.

Fourth Embodiment

Figure 9:
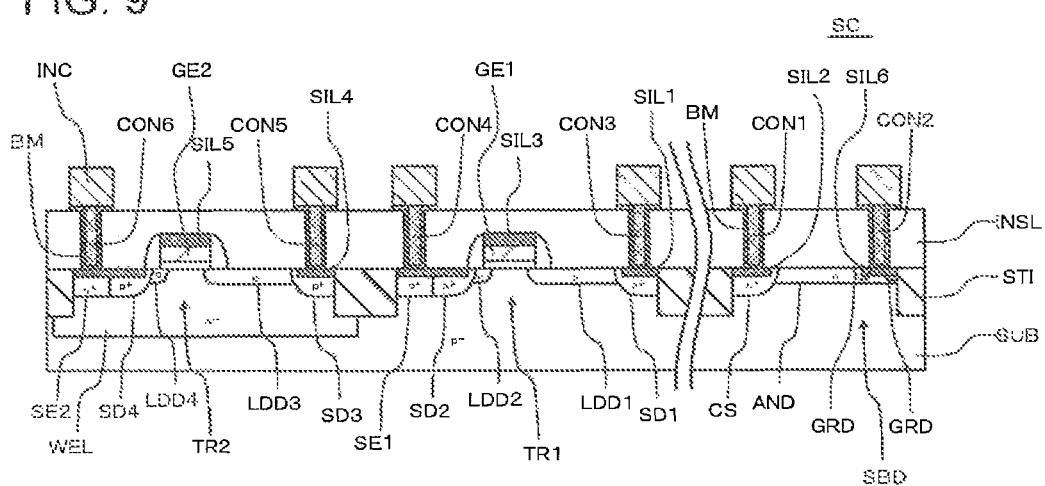
FIG. 9 is a cross-sectional view illustrating a configuration of a semiconductor device according to a fourth embodiment.

FIG. 9 is a cross-sectional view illustrating a configuration of a semiconductor device SC according to a fourth embodiment. The semiconductor device SC according to the embodiment has the same configuration as that of the semiconductor device SC according to the second embodiment, except that a second conductivity type region GRD is provided in the Schottky barrier diode SBD.

The second conductivity type region GRD is a $p^+$ impurity region, and is provided along the edge of the Schottky junction, that is, the edge of the silicide layer SIL6, when seen in a plan view. The second conductivity type region GRD is formed in the same process as forming the third impurity regions SD3 and SD4.

Figure 10:
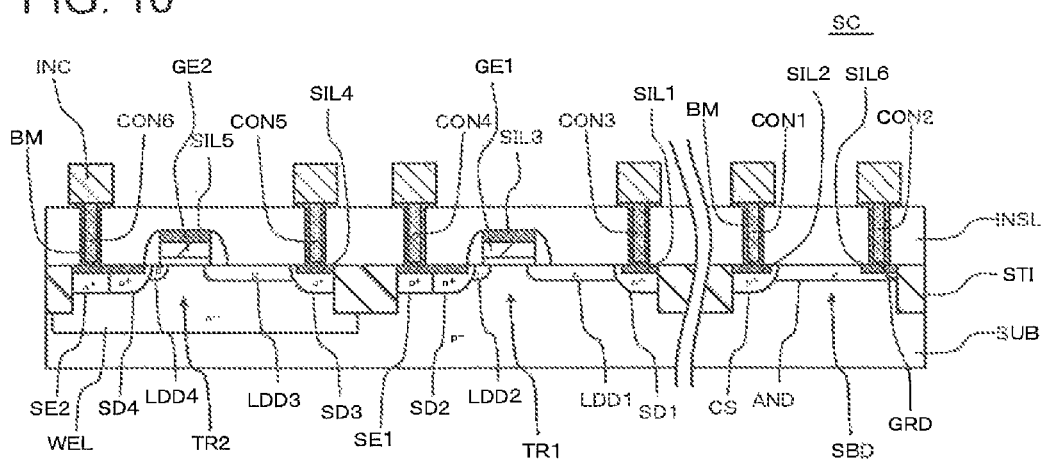
FIG. 10 is a cross-sectional view illustrating a modified example of FIG. 9.

In the example shown in the drawing, the second conductivity type region GRD is provided at both the edge on the second impurity region CS side and the edge on the element isolation film STI side in the silicide layer SIL6. However, as shown in FIG. 10, the second conductivity type region GRD may not be provided at the edge on the opposite side to the element isolation film STI in the silicide layer SIL6.

In the embodiment, it is also possible to obtain the same effect as that in the first embodiment. In addition, since the second conductivity type region GRD is formed, it is possible to prevent an electric field from being concentrated on the peripheral portion of the silicide layer SIL6.

Fifth Embodiment

Figure 11:
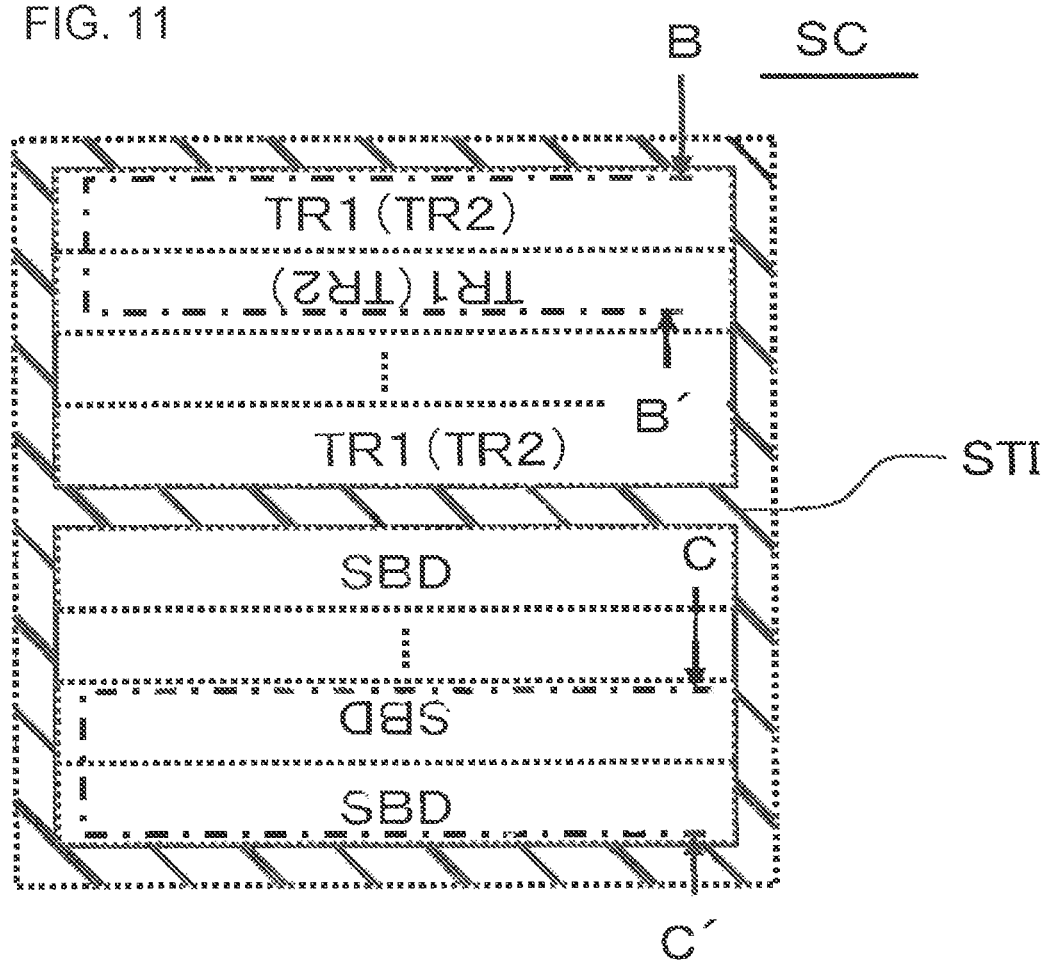
FIG. 11 is a plan view illustrating a configuration of a semiconductor device according to a fifth embodiment.
Figure 12:
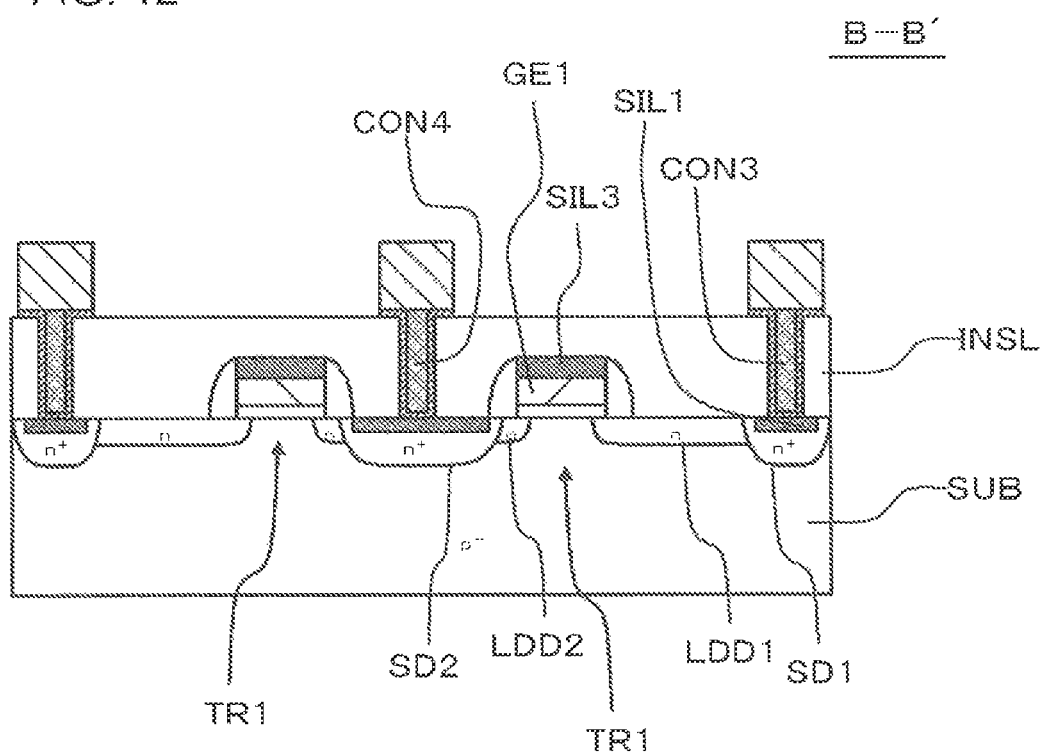
FIG. 12 is a diagram illustrating a cross section taken along line B-B' of FIG. 11.
Figure 13:
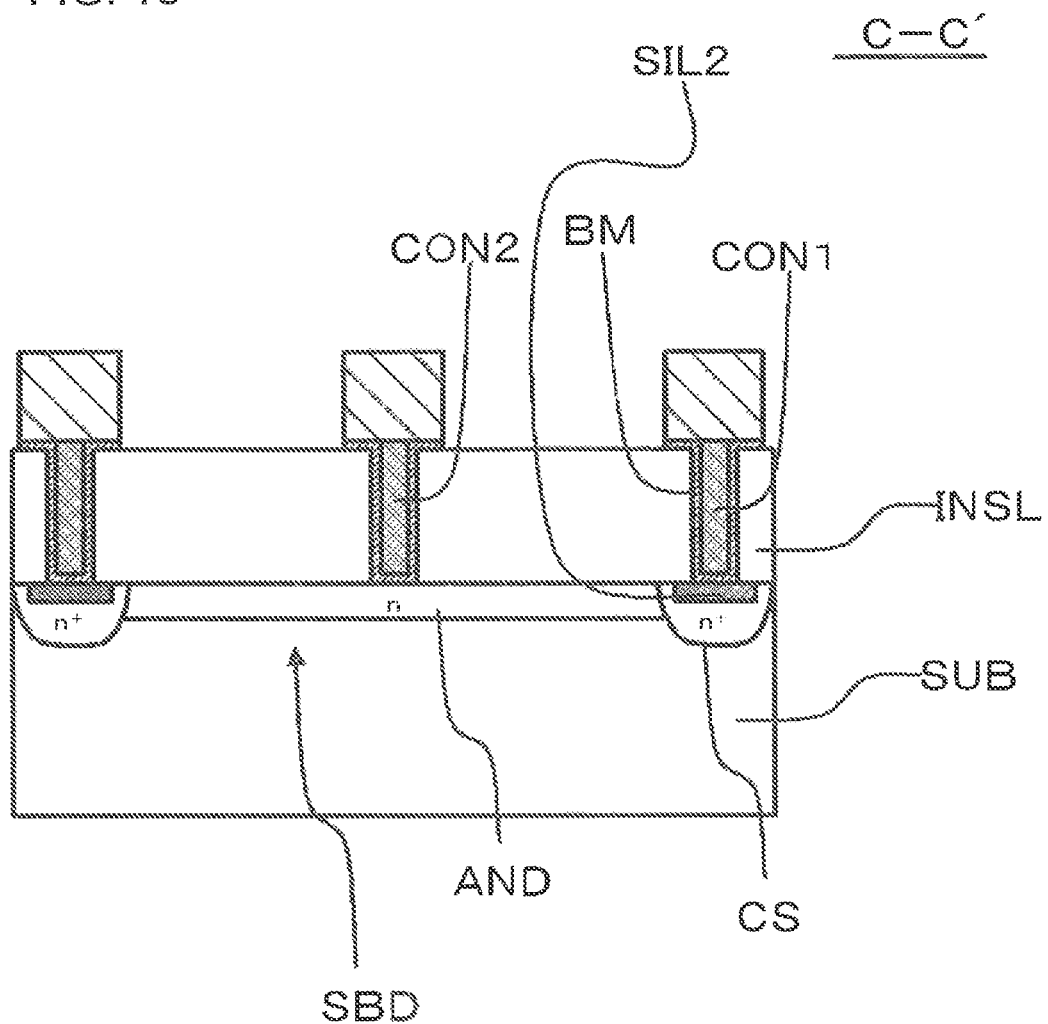
FIG. 13 is a diagram illustrating a cross section taken along line C-C' of FIG. 11.

FIG. 11 is a plan view illustrating a configuration of a semiconductor device SC according to a fifth embodiment. FIG. 12 is a diagram illustrating a cross section taken along line B-B' of FIG. 11. FIG. 13 is a diagram illustrating a cross section taken along line C-C' of FIG. 11. As shown in FIG. 11, the semiconductor device SC according to the embodiment is configured such that a plurality of first transistors TR1 (or second transistors TR2) are disposed within one element formation region, and a plurality of Schottky barrier diodes SBD are disposed within another element formation region. The configuration of the Schottky barrier diode SBD is the same as those of any of the first to fourth embodiments. FIGS. 12 and 13 show a case similar to that in the first embodiment.

The plurality of first transistors TR1 are disposed so that the directions thereof are alternate with each other. For this reason, as shown in the cross-sectional view of FIG. 12, two first transistors TR1 adjacent to each other share the first impurity region SD1 or the first impurity region SD2.

In addition, the plurality of Schottky barrier diodes SBD are disposed so that the directions thereof are alternate with each other. For this reason, as shown in the cross-sectional view of FIG. 13, two Schottky barrier diodes SBD adjacent to each other share the second impurity region CS or the second low-concentration impurity region AND.

In the embodiment, it is also possible to obtain the same effect as those in any of the first to fourth embodiments. In addition, the two first transistors TR1 adjacent to each other share the first impurity region SD1 or the first impurity region SD2, and the two Schottky barrier diodes SBD adjacent to each other shares the second impurity region CS or the second low-concentration impurity region AND. For this reason, it is possible to reduce the size of the semiconductor device SC.

Sixth Embodiment

Figure 14:
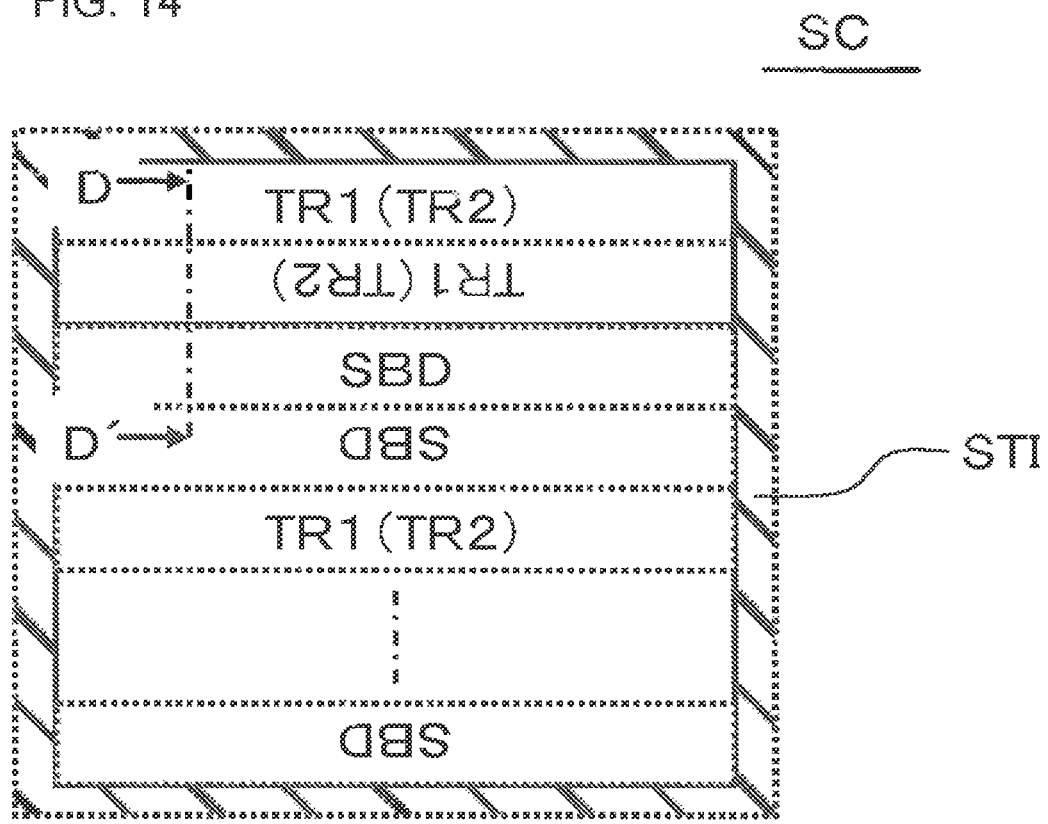
FIG. 14 is a plan view illustrating a configuration of a semiconductor device according to a sixth embodiment.
Figure 15:
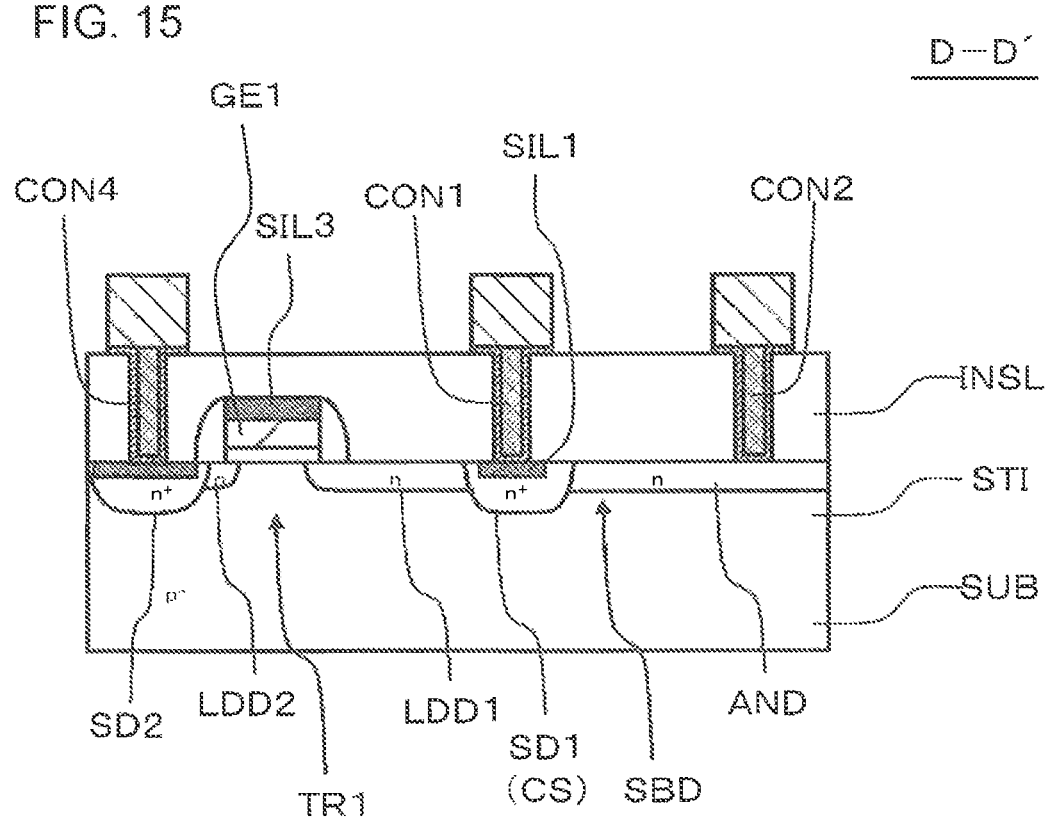
FIG. 15 is a diagram illustrating a cross section taken along line D-D' of FIG. 14.

FIG. 14 is a plan view illustrating a configuration of a semiconductor device SC according to a sixth embodiment. FIG. 15 is a diagram illustrating a cross section taken along line D-D' of FIG. 14. The semiconductor device SC according to the embodiment is configured such that a transistor group constituted by two first transistors TR1 (or second transistors TR2) and a diode group constituted by two Schottky barrier diodes SBD are alternately disposed within one element formation region. The configuration of one transistor group is as described with reference to FIG. 12 in the fifth embodiment, and the configuration of one diode group is as described with reference to FIG. 13 in the fifth embodiment.

FIG. 15 is a diagram illustrating a cross section taken along line D-D' of FIG. 14. As shown in the drawing, the first impurity region SD1 of the first transistor TR1 also serves as the second impurity region CS of the Schottky barrier diode SBD. For this reason, the first contact CON1 is connected to the first impurity region SD1. Meanwhile, the configuration of the Schottky barrier diode SBD is the same as those of any of the first to fourth embodiments. The drawing shows a case similar to that in the first embodiment.

In the embodiment, it is also possible to obtain the same effect as that in the fifth embodiment. In addition, since the first impurity region SD1 also serves as the second impurity region CS, it is possible to reduce the size of the semiconductor device SC.

Seventh Embodiment

Figure 16:
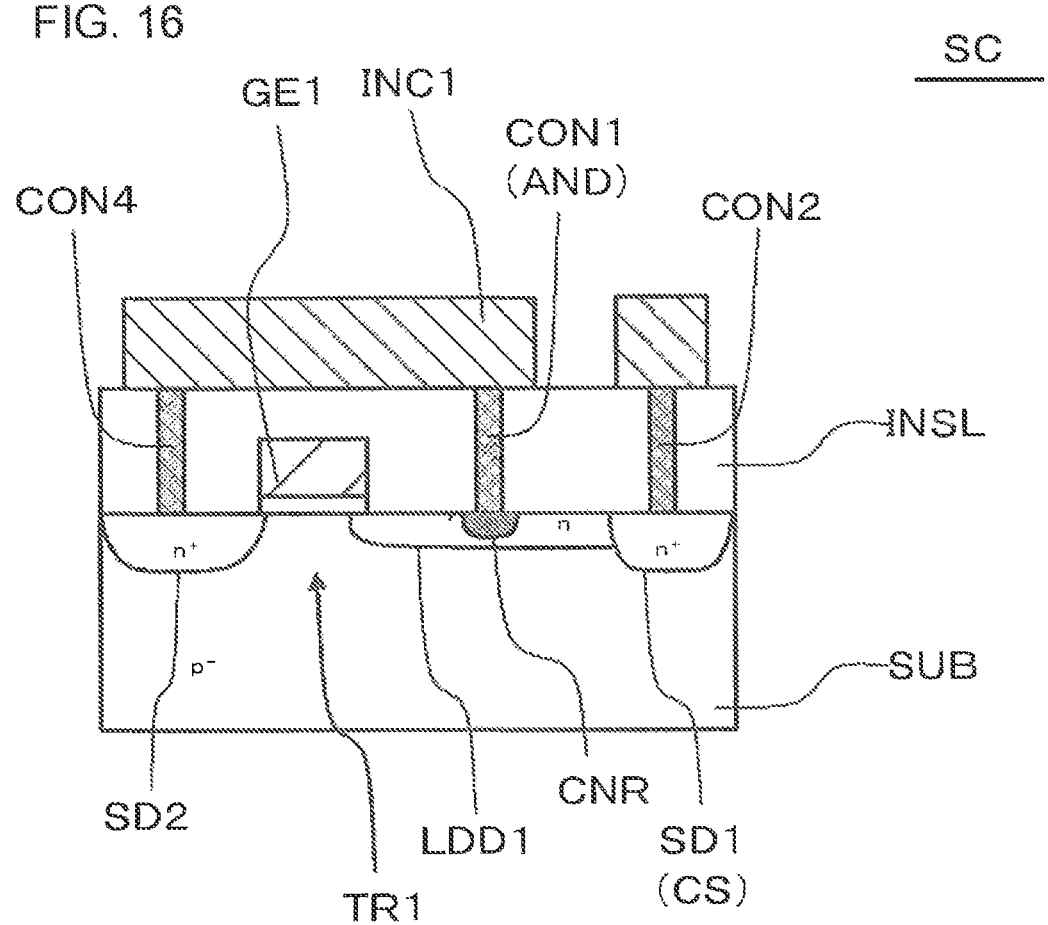
FIG. 16 is a cross-sectional view illustrating a configuration of a semiconductor device according to a seventh embodiment.

FIG. 16 is a cross-sectional view illustrating a configuration of a semiconductor device SC according to a seventh embodiment. The semiconductor device SC according to the embodiment includes a substrate SUB, gate electrode GE1, a first impurity region SD1 serving as a drain, a first impurity region SD2 serving as a source, a first low-concentration impurity region LDD1 (low-concentration region), a junction region CNR (first junction region), and a first contact CON1. The configurations of the substrate SUB, the gate electrode GE1, the first impurity region SD1, the first impurity region SD2, and the first low-concentration impurity region LDD1 are the same as those in the first embodiment, and thus, the description thereof will not be repeated.

In the embodiment, the first contact CON1 is connected to a portion of the first low-concentration impurity region LDD1. The material of the first contact CON1 is a material for producing a Schottky junction in the interface with a substrate material, and a metal material of which the work function is normally located in a forbidden band of the substrate material is used. For example, Al, Ti, W, Cr, Mo, or an alloy thereof is used for a Si substrate, and Ni, Pt, other metals, an alloy thereof, or the like is used for a GaN substrate. Meanwhile, as described later, since the contact CON1 functions as a Schottky electrode, the first contact CON1 may be formed of materials other than those of another contact. The junction region CNR is formed in a portion to which the first contact CON1 is connected in the first low-concentration impurity region LDD1. The junction region CNR has a higher impurity concentration than that of the first low-concentration impurity region LDD1, and has a lower impurity concentration than those of the first impurity region SD1 and the first impurity region SD2. In addition, the upper end of the first contact CON1 is connected to the first impurity region SD2 through an interconnect INC1 and the contact CON4.

In such a configuration, the first contact CON1 is connected to the junction region CNR by a Schottky junction. The first contact CON1 functions as an anode of the Schottky barrier diode SBD, and the first impurity region SD1 functions as a cathode of the Schottky barrier diode SBD. In the embodiment, the junction region CNR has a higher impurity concentration than that of the first low-concentration impurity region LDD1. For this reason, the junction region CNR is not likely to be depleted even when the first contact CON1 has a Schottky connection. For this reason, it is possible to suppress an increase in the on-resistance of the first transistor TR1.

In the embodiment, when the impurity concentration of the junction region CNR is set to $N_d$, the depth of the junction region CNR is set to $\sigma_d$, the impurity concentration of the first low-concentration impurity region LDD1 is set to $N_{LDD}$, and the depth of the first low-concentration impurity region LDD1 is set to $\sigma_{LDD}$, it is preferable to satisfy the following Expression (1).

$$N_d > N_{LDD} \cdot \sigma_{LDD}^2 / \sigma_d^2 \qquad (1)$$

Figure 17:
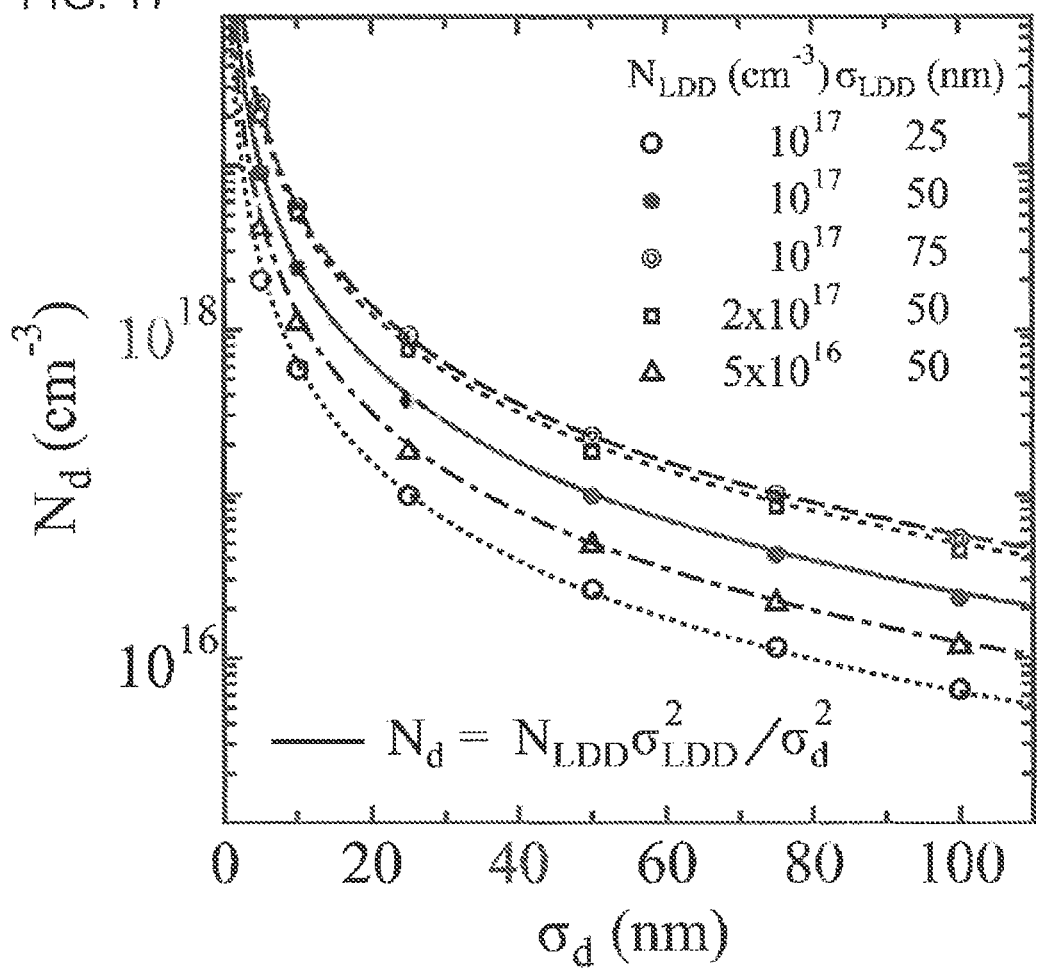
FIG. 17 is a diagram illustrating results obtained by simulating an impurity concentration $N_d$ required for setting the resistance of a first low-concentration impurity region to the same value as that before the formation of a junction region, when a depth $\sigma_d$ of the junction region formed in a substrate is set to a variable.

The reason will be described with reference to FIG. 17. FIG. 17 shows results obtained by simulating the impurity concentration $N_d$ required for setting the resistance of the first low-concentration impurity region LDD1 to the same value as that before the formation of the junction region CNR, when the depth $\sigma_d$ of the junction region CNR formed in the substrate is set to a variable. The curve showing the simulation result is expressed by $N_d = N_{LDD} \cdot \sigma_{LDD}^2 / \sigma_d^2$. For this reason, when $N_d$ satisfies Expression (1), the on-resistance of the first low-concentration impurity region LDD1 is reduced by forming the junction region CNR.

Meanwhile, in FIG. 17, the impurity concentration is a peak concentration when the impurity concentration distribution in a depth direction is approximated by a Gaussian distribution, and the depth of the impurity region is dispersion when the impurity concentration distribution in a depth direction is approximated by a Gaussian distribution.

Figure 18:
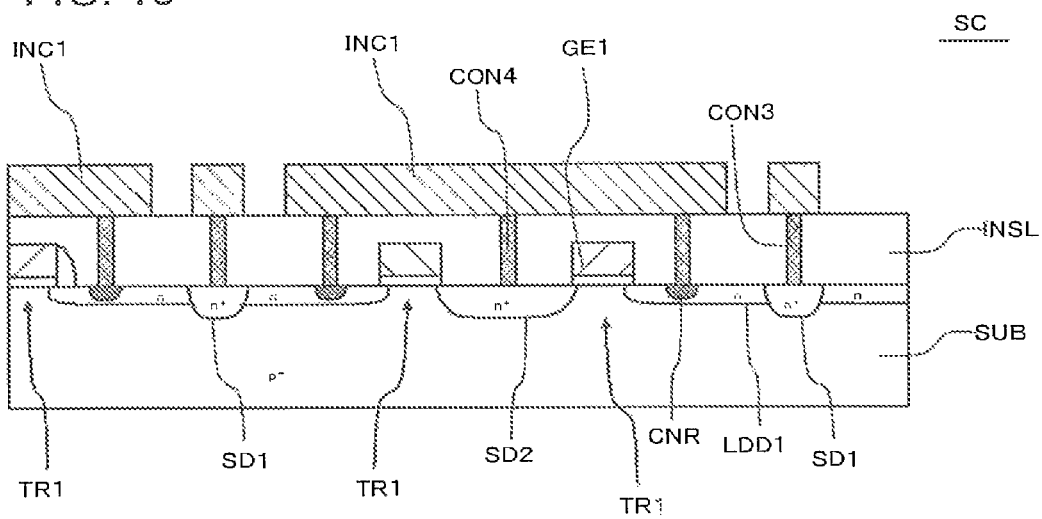
FIG. 18 is a cross-sectional view illustrating a layout when a plurality of first transistors and Schottky barrier diodes shown in FIG. 16 are formed in one substrate.

FIG. 18 is a cross-sectional view illustrating a layout when a plurality of first transistors TR1 and Schottky barrier diodes SBD shown in FIG. 16 are formed in one substrate SUB. In the example shown in the drawing, the first transistors TR1 adjacent to each other share the first impurity region SD2 or the first impurity region SID1. Specifically, a first one of the first transistors TR1 (first transistor TR1 on the right side of the drawing) and a second one of the first transistors TR1 (first transistor TR1 in the middle of the drawing) located next thereto share the first impurity region SD2. A pair of first transistors TR1 located next thereto, that is, the second one of the first transistors TR1 (first transistor TR1 in the middle of the drawing) and a third one of the first transistors TR1 (first transistor TR1 on the left side of the drawing) located next thereto share the first impurity region SD1. Such a layout is repeatedly taken, and thus a plurality of first transistors TR1 can be disposed in a narrow space.

Meanwhile, in the semiconductor device SC shown in FIG. 16, the junction region CNR is formed shallower than the first low-concentration impurity region LDD1. Here, the definition of the depth of the junction region CNR and the definition of the depth of the first low-concentration impurity region LDD1 are the same as, for example, the definition used in the description relevant to FIG. 17.

A method for manufacturing the semiconductor device SC according to the embodiment is as follows. First, a gate insulating film and the gate electrode GE1 are formed in the substrate SUB. Next, impurities are implanted into the substrate SUB using the gate electrode GE1 as a mask. Thereby, the first low-concentration impurity region LDD1 is formed. Next, a mask pattern is formed on the substrate SUB, and impurities are implanted into the substrate SUB using the mask pattern as a mask. Thereby, the first impurity region SD1 and the first impurity region SD2 are formed. Thereafter, the mask pattern is removed. Next, another mask pattern is formed on the substrate SUB, and impurities are implanted into the substrate SUB using the mask pattern as a mask. Thereby, the junction region CNR is formed. Thereafter, the insulating interlayer INSL, the first contact CON1, the second contact CON2, the contact CON4, and the interconnect INC1 are formed.

Figure 19:
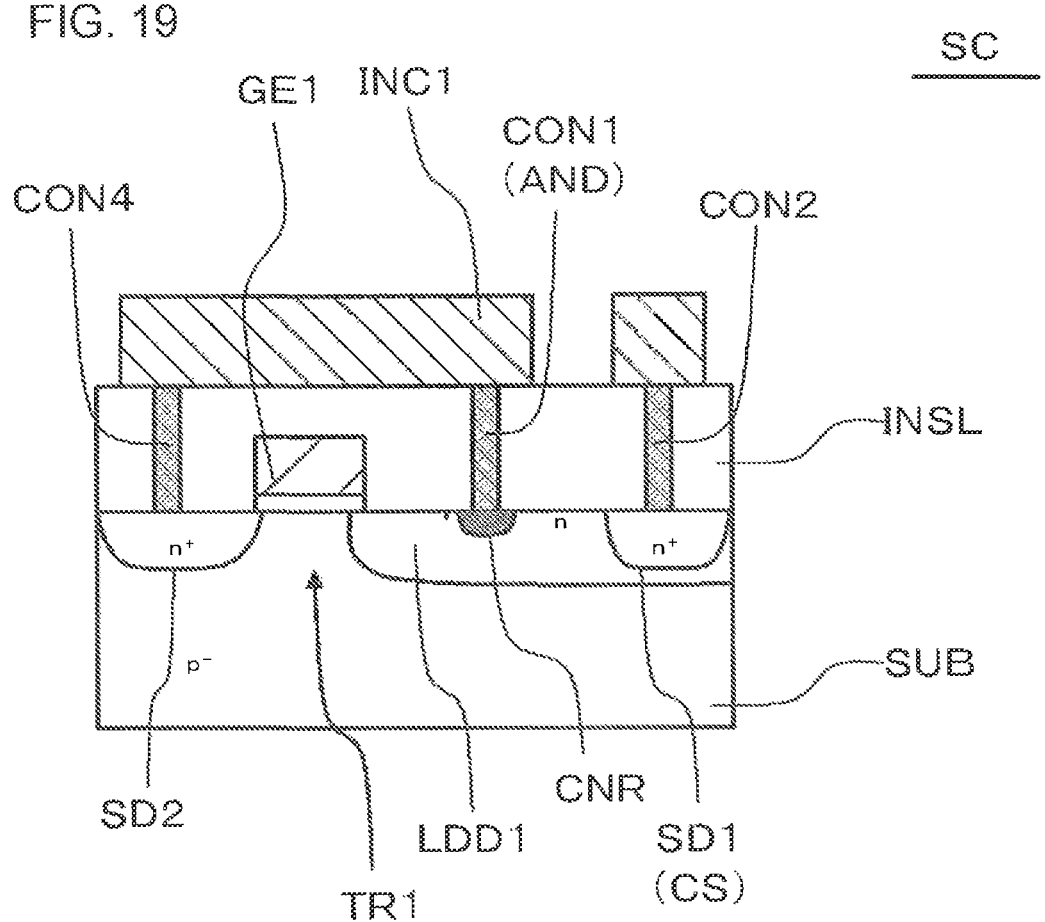
FIG. 19 is a cross-sectional view illustrating a first modified example of the semiconductor device shown in FIG. 16.

FIG. 19 is a cross-sectional view illustrating a first modified example of the semiconductor device SC shown in FIG. 16. In the modified example, the first low-concentration impurity region LDD1 is formed deeper than the first impurity region SD1. Specifically, the first impurity region SD1 is formed in a portion of the surface layer of the first low-concentration impurity region LDD1.

Figure 20:
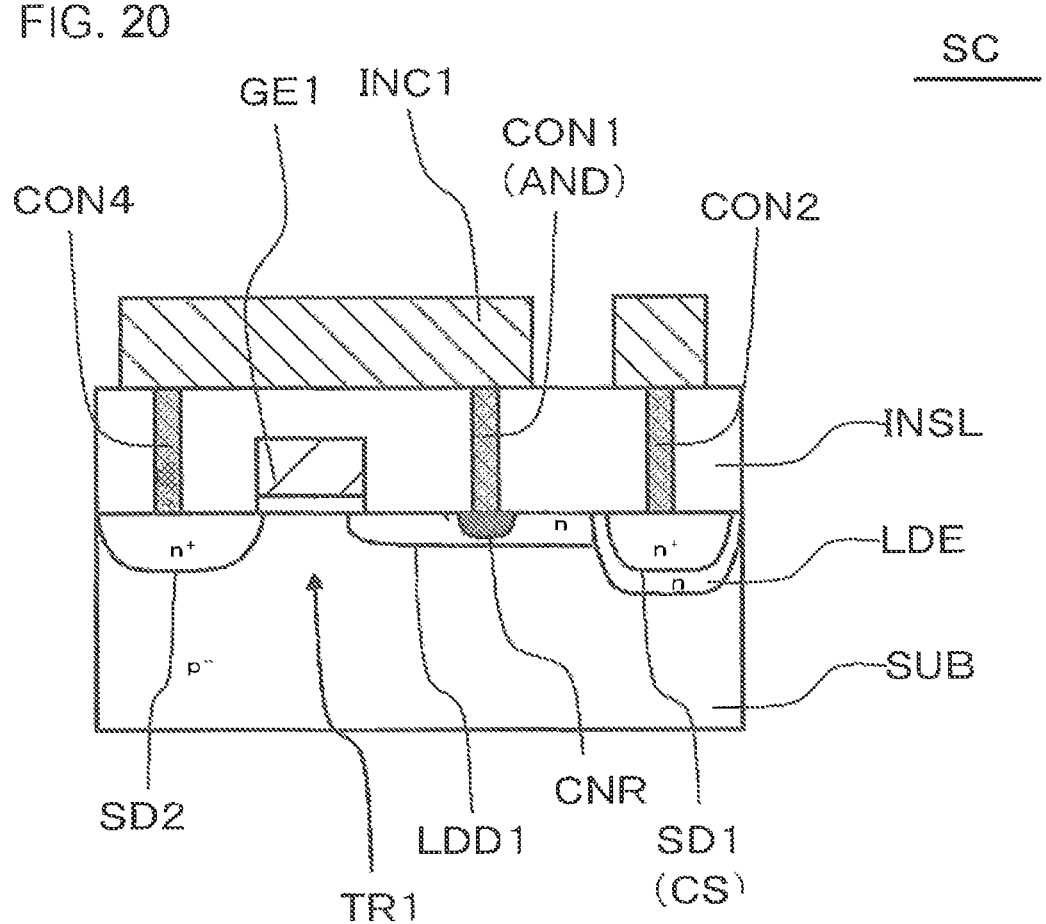
FIG. 20 is a cross-sectional view illustrating a second modified example of the semiconductor device shown in FIG. 16.

FIG. 20 is a cross-sectional view illustrating a second modified example of the semiconductor device SC shown in FIG. 16. In the modified example, the first impurity region SD1 is deeper than the first low-concentration impurity region LDD1. A low-concentration impurity region LDE is formed in the periphery of the first impurity region SD1. Specifically, the low-concentration impurity region LDE is formed in a region in which the first impurity region SD1 is formed in the substrate SUB. The low-concentration impurity region LDE is deeper than the first low-concentration impurity region LDD1. The first impurity region SD1 is formed in the inside of the low-concentration impurity region LDE.

As stated above, according to the embodiment, the first contact CON1 is connected to a region in which the junction region CNR is formed in the first low-concentration impurity region LDD1. The junction region CNR has a higher impurity concentration than that of the first low-concentration impurity region LDD1. For this reason, the junction region CNR is not likely to be depleted even when the first contact CON1 has a Schottky connection. Therefore, it is possible to suppress an increase in the on-resistance of the first transistor TR1.

Eighth Embodiment

FIG. 21 is a cross-sectional view illustrating a configuration of a semiconductor device SC according to an eighth embodiment. The semiconductor device SC according to the embodiment has the same configuration as that of the semiconductor device SC according to the seventh embodiment, except that the junction region CNR is deeper than the first low-concentration impurity region LDD1.

In the embodiment, it is also possible to obtain the same effect as that in the seventh embodiment. In addition, since the junction region CNR can be deepened, it is possible to reduce the impurity concentration of the junction region CNR as expressed in Expression (1) shown in the seventh embodiment. Thereby, it is possible to suppress the concentration of an electric field in the junction region CNR.

Ninth Embodiment

Figure 22A:
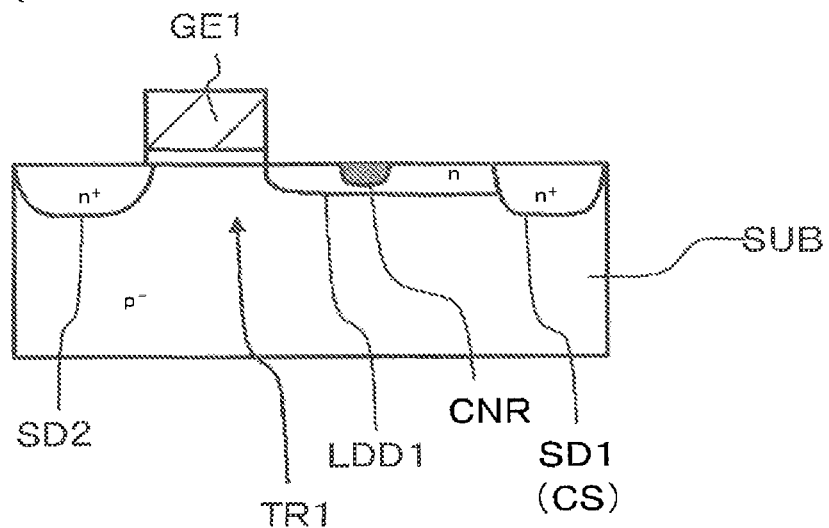
FIGS. 22A and 22B are cross-sectional views illustrating a method for manufacturing a semiconductor device according to a ninth embodiment.

FIGS. 22A and 22B and FIGS. 23A and 23B are cross-sectional views illustrating a method for manufacturing a semiconductor device SC according to a ninth embodiment. First, as shown in FIG. 22A, a gate insulating film, a gate electrode GE1, a first low-concentration impurity region LDD1, a first impurity region SD1, a first impurity region SD2, and a junction region CNR are formed in a substrate SUB. Meanwhile, these configurations are the same as those in FIG. 16, but may be the same as the examples shown in FIGS. 19 to 21.

Figure 22B:
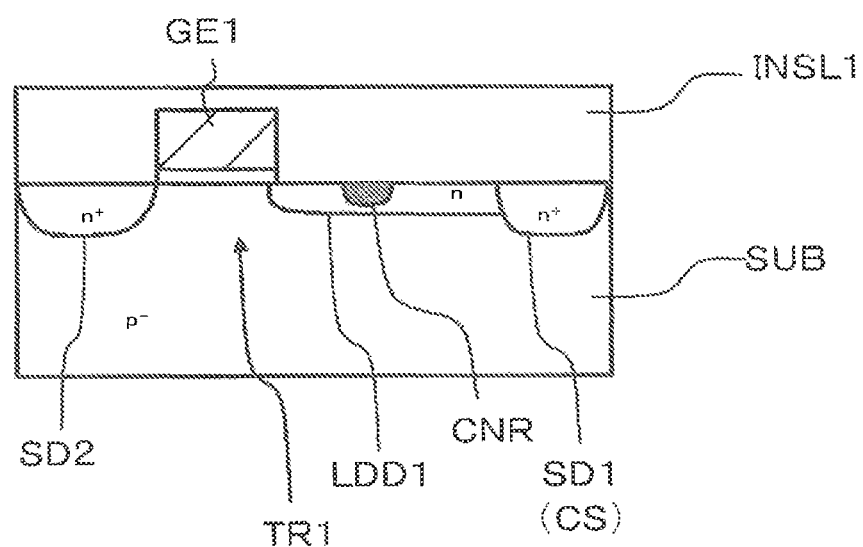

Next, as shown in FIG. 22B, an insulating interlayer INSL1 is formed on the substrate SUB and the gate electrode GE1.

Figure 23A:
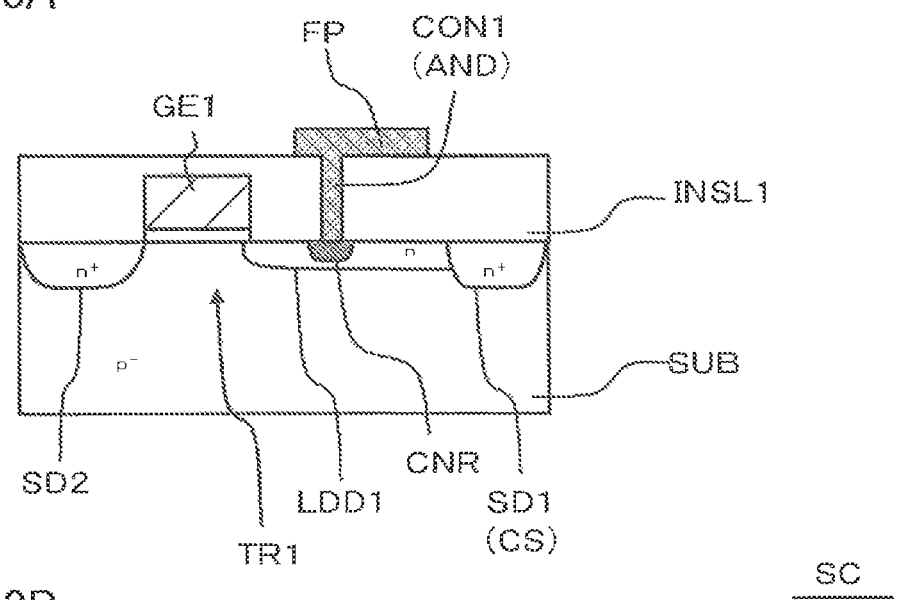
FIGS. 23A and 23B are cross-sectional views illustrating the method for manufacturing the semiconductor device according to the ninth embodiment.

Next, as shown in FIG. 23A, a connection hole for embedding the first contact CON1 in the insulating interlayer INSL1 is formed. Next, a conductive film is formed in the connection hole and on the insulating interlayer INSL1. Next, a mask pattern (not shown) is formed on the conductive film, and the conductive film is etched using the mask pattern as a mask. Thereby, the contact CON1 and a field plate electrode FP are formed. The field plate electrode FP is located on the insulating interlayer INSL1, and extends from the upper portion of the first contact CON1 toward the first impurity region SD1, when seen in a plan view. Thereafter, the mask pattern is removed.

Figure 23B:
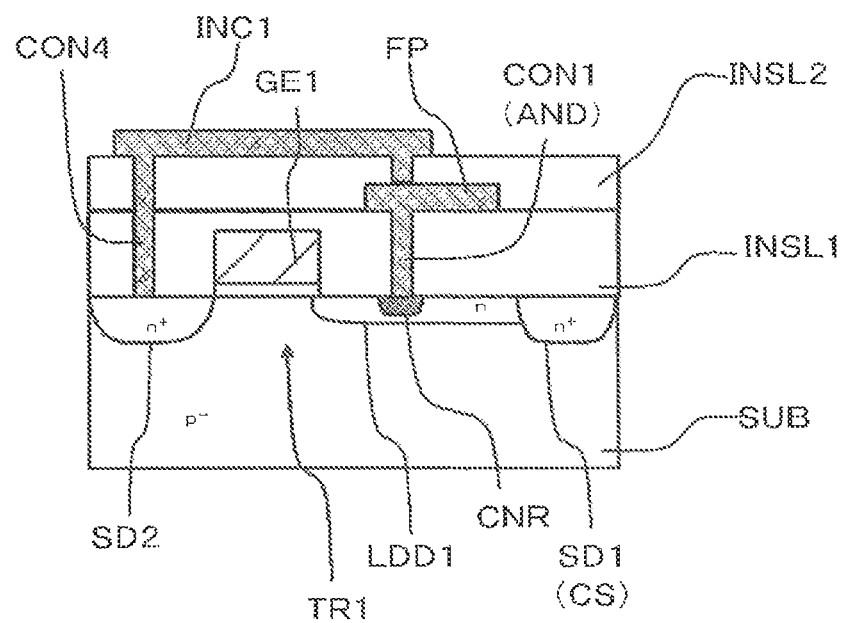

Next, as shown in FIG. 23B, an insulating interlayer INSL2 formed on the insulating interlayer INSL1 and the field plate electrode FP. Next, a connection hole located on the field plate electrode FP is formed in the insulating interlayer INSL2, and a connection hole for embedding the contact CON4 is formed in the insulating interlayer INSL2 and the insulating interlayer INSL1. Next, a conductive film is formed in these connection holes and on the insulating interlayer INSL2. Next, a mask pattern (not shown) is formed on the conductive film, and the conductive film is etched using the mask pattern as a mask. Thereby, a via, connected to the contact CON4, the interconnect INC1, and the field plate electrode FP, is formed. The interconnect INC1 connects the contact CON4 to the via. Thereafter, the mask pattern is removed.

In the embodiment, it is also possible to obtain the same effect as that in the seventh embodiment. In addition, since the field plate electrode FP is formed, it is possible to suppress the concentration of an electric field on a portion overlapping the end of the gate electrode GE1, when seen in a plan view, in the first low-concentration impurity region LDD1.

Tenth Embodiment

Figure 24A:
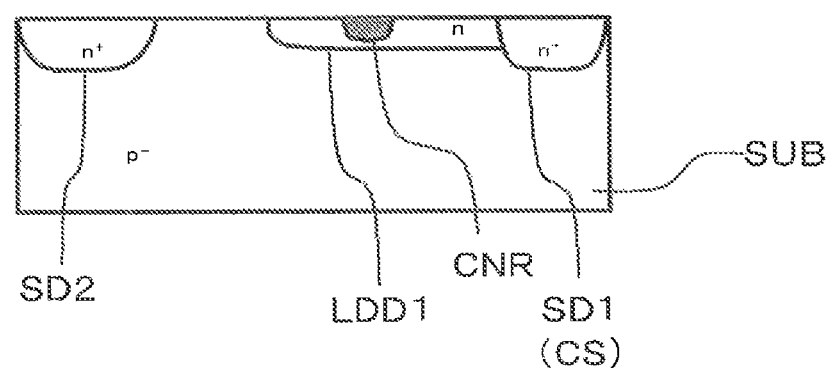
FIGS. 24A and 24B are cross-sectional views illustrating a method for manufacturing of a semiconductor device according to a tenth embodiment.

FIGS. 24A and 24B to FIGS. 27A and 27B are cross-sectional views illustrating a method for manufacturing a semiconductor device SC according to a tenth embodiment. First, as shown in FIG. 24A, a first low-concentration impurity region LDD1, a first impurity region SD1, a first impurity region SD2, and a junction region CNR are formed in a substrate SUB. Meanwhile, these configurations are the same as those in FIG. 16, but may be the same as the examples shown in FIGS. 19 to 21.

Figure 24B:
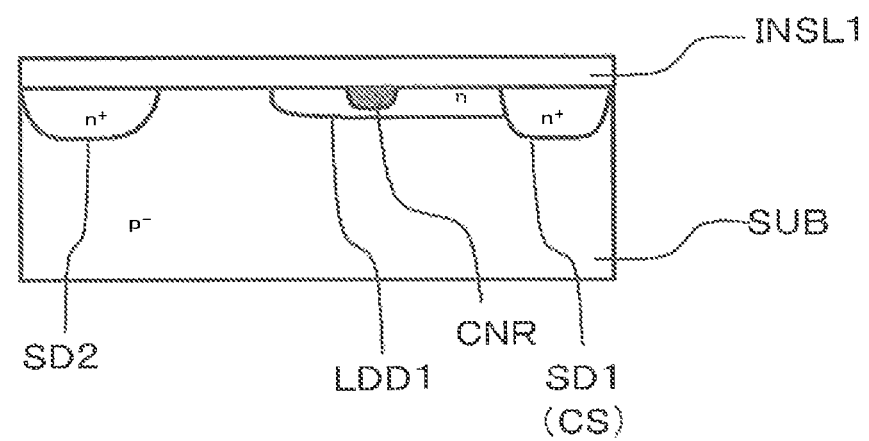

Next, as shown in FIG. 24B, an insulating interlayer INSL1 is formed on the substrate SUB.

Figure 25A:
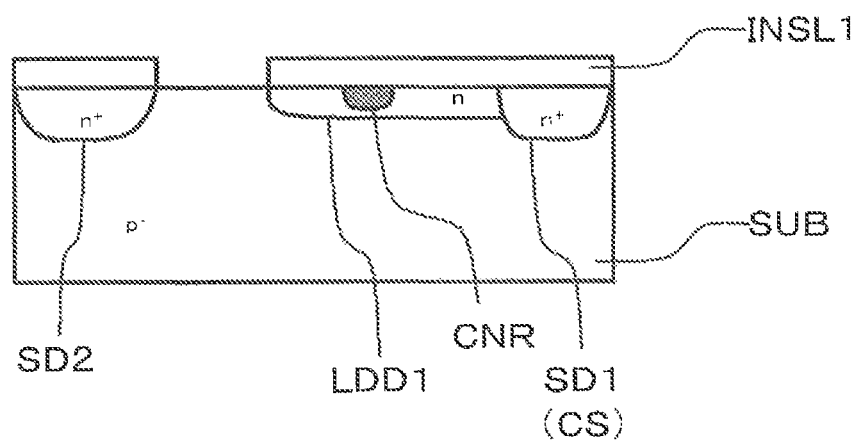
FIGS. 25A and 25B are cross-sectional views illustrating the method for manufacturing the semiconductor device according to the tenth embodiment.

Next, as shown in FIG. 25A, an opening is formed in the insulating interlayer INSL1. The opening is located in a region in which a gate electrode GE1 is formed on the substrate SUB.

Figure 25B:
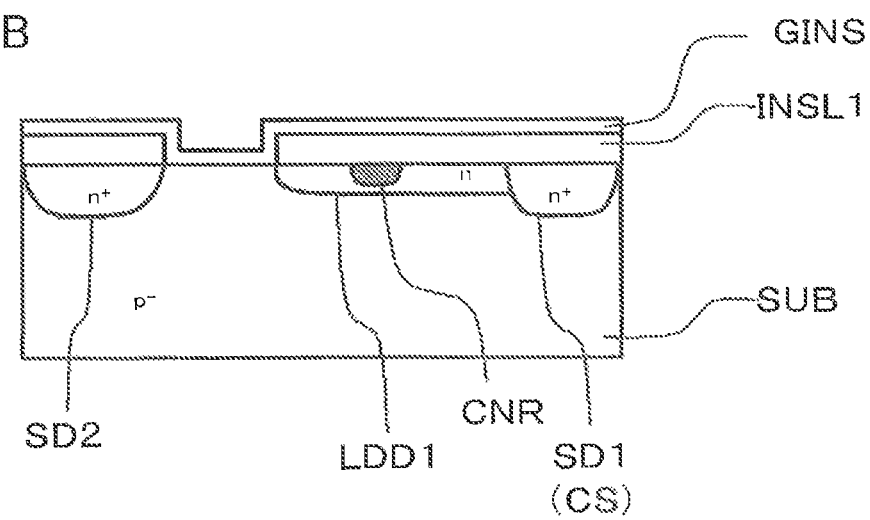

Next, as shown in FIG. 25B, a gate insulating film GINS is formed on the substrate SUB located within the opening of the insulating interlayer INSL1. In the example shown in the drawing, the gate insulating film GINS is formed by a deposition method. For this reason, the gate insulating film GINS is also formed on the insulating interlayer INSL1.

Figure 26A:
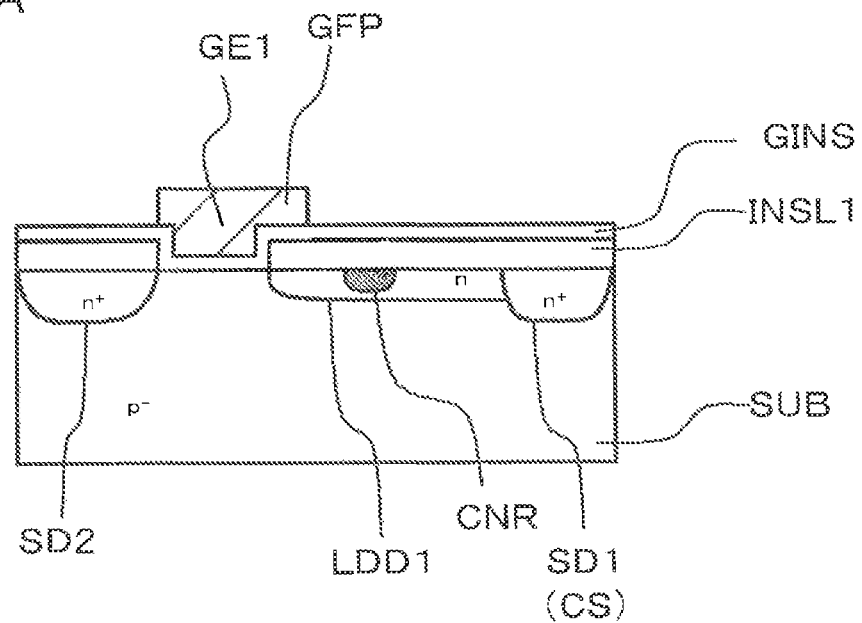
FIGS. 26A and 26B are cross-sectional views illustrating the method for manufacturing the semiconductor device according to the tenth embodiment.

Next, as shown in FIG. 26A, a conductive film serving as the gate electrode GE1, for example, a polysilicon film is formed on the gate insulating film GINS. Next, the polysilicon film is selectively removed. Thereby, the gate electrode GE1 is formed. In this process, the gate electrode GE1 extends along the upper portion of the insulating interlayer INSL1 in a direction in which a portion thereof is close to the first impurity region SD1, when seen in a plan view. This extending portion serves as a gate field plate GFP.

Figure 26B:
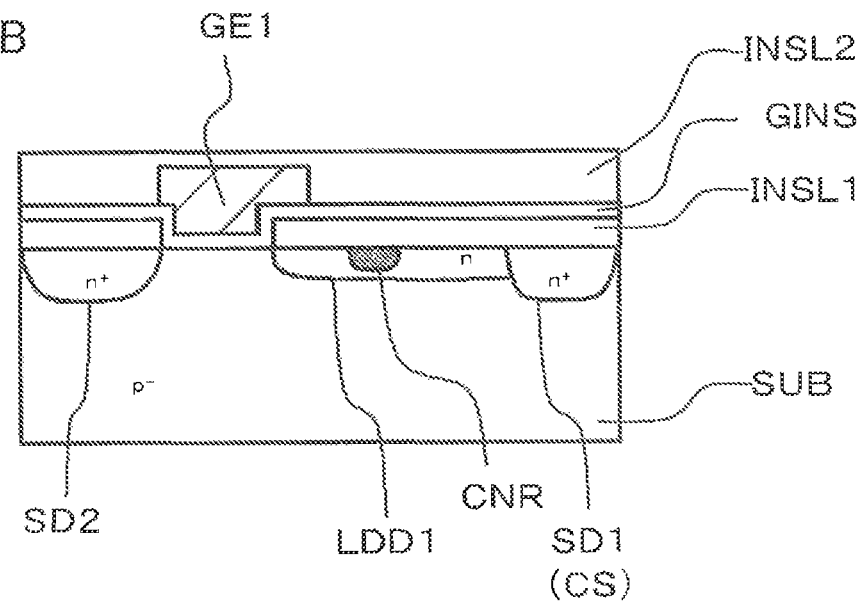

Next, as shown in FIG. 26B, an insulating interlayer INSL2 is formed on the gate electrode GE1 and the gate insulating film GINS.

Figure 27A:
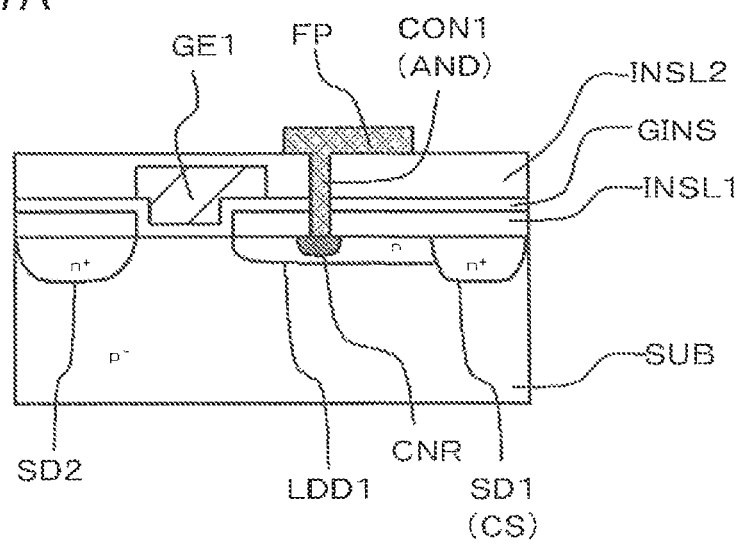
FIGS. 27A and 27B are cross-sectional views illustrating the method for manufacturing the semiconductor device according to the tenth embodiment.

Next, as shown in FIG. 27A, the first contact CON1 is embedding in the insulating interlayer INSL2, the gate insulating film GINS, and the insulating interlayer INSL1, and the field plate electrode FP is formed on the insulating interlayer INSL2. A forming method thereof is the same as the method for embedding the first contact CON1 in the insulating interlayer INSL1 in the ninth embodiment, and forming the field plate electrode FP on the insulating interlayer INSL1.

Figure 27B:
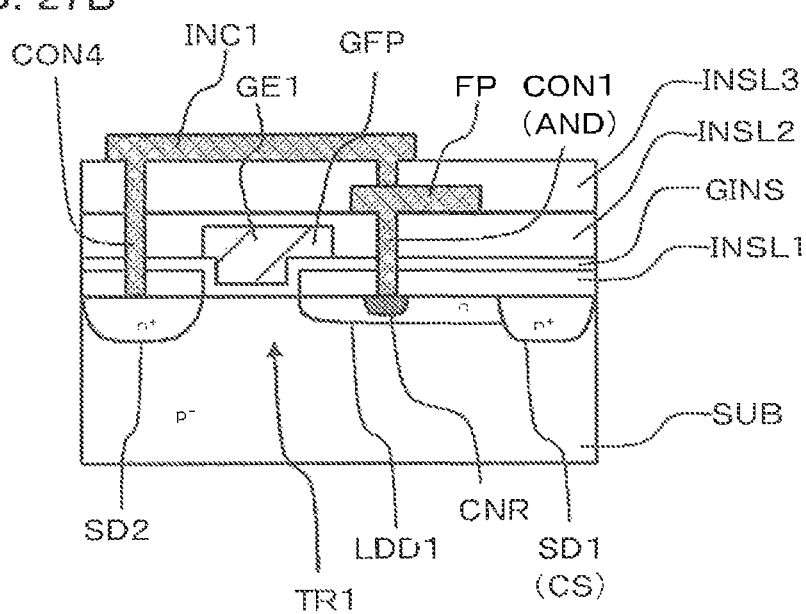

Next, as shown in FIG. 27B, an insulating interlayer INSL3 is formed on the insulating interlayer INSL2 and the field plate electrode FP. Next, a via connected to the field plate electrode FP is embedded in the insulating interlayer INSL3, an interconnect INC1 is formed on the insulating interlayer INSL3, and the contact CON4 is embedded in the insulating interlayers INSL3 and INSL2, the gate insulating film GINS, and the insulating interlayer INSL1. A forming method thereof is the same as the method for embedding the contact CON4 in the insulating interlayers INSL1 and INSL2 in the ninth embodiment, forming the interconnect INC1 on the insulating interlayer INSL2, and embedding the via in the insulating interlayer INSL2.

In the embodiment, it is possible to obtain the same effect as that in the ninth embodiment. In addition, since the gate field plate GFP is formed in the gate electrode GE1, it is possible to further suppress the concentration of an electric field on a portion overlapping the end of the gate electrode GE1, when seen in a plan view, in the first low-concentration impurity region LDD1.

Eleventh Embodiment

Figure 28:
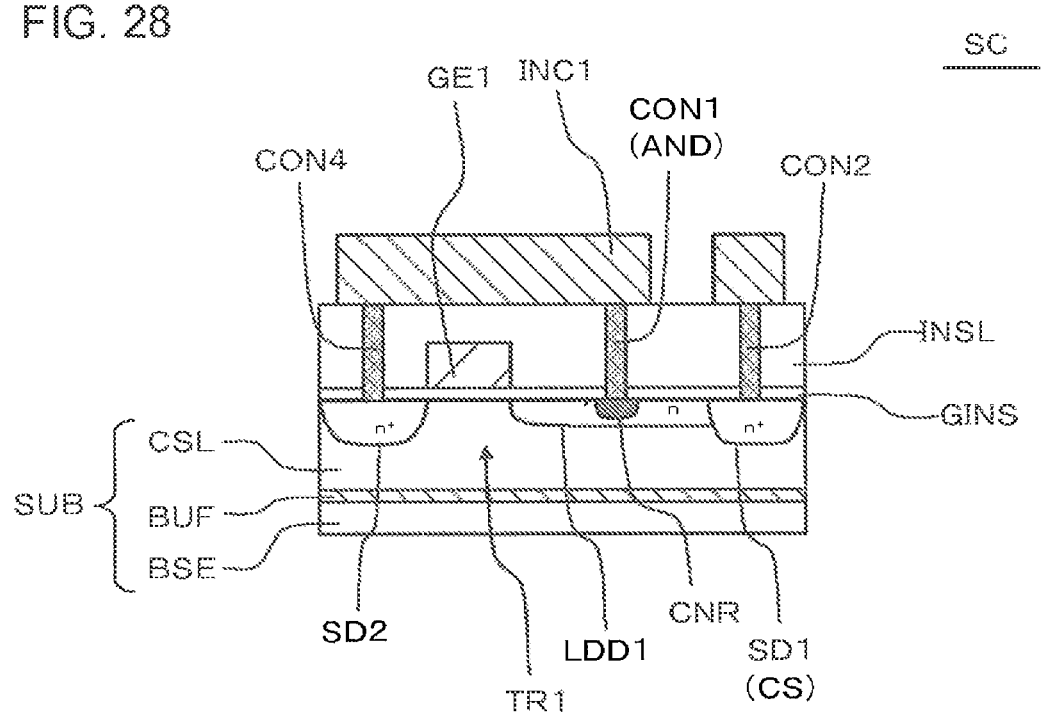
FIG. 28 is a cross-sectional view illustrating a configuration of a semiconductor device according to an eleventh embodiment.

FIG. 28 is a cross-sectional view illustrating a configuration of a semiconductor device SC according to an eleventh embodiment. The semiconductor device SC according to the embodiment has the same configuration as that of the semiconductor device SC according to the seventh embodiment, except that the substrate SUB is a compound semiconductor substrate.

Specifically, the substrate SUB is a substrate obtained by growing a nitride semiconductor layer CSL on a support substrate BSE with a buffer layer BUF interposed therebetween. The support substrate BSE is, for example, a silicon substrate, and the nitride semiconductor layer CSL is, for example, GaN or AlGaN. The first impurity regions SD1 and SD2, the first low-concentration impurity region LDD1, and the junction region CNR are formed in the nitride semiconductor layer CSL. In addition, the gate insulating film GINS is formed on the nitride semiconductor layer CSL by a deposition method.

A method for manufacturing the semiconductor device SC according to the embodiment is the same as the method for manufacturing the semiconductor device SC according to the seventh embodiment.

According to the embodiment, in the semiconductor device SC using the nitride semiconductor layer CSL, it is also possible to obtain the same effect as that in the seventh embodiment.

Twelfth Embodiment

Figure 29:
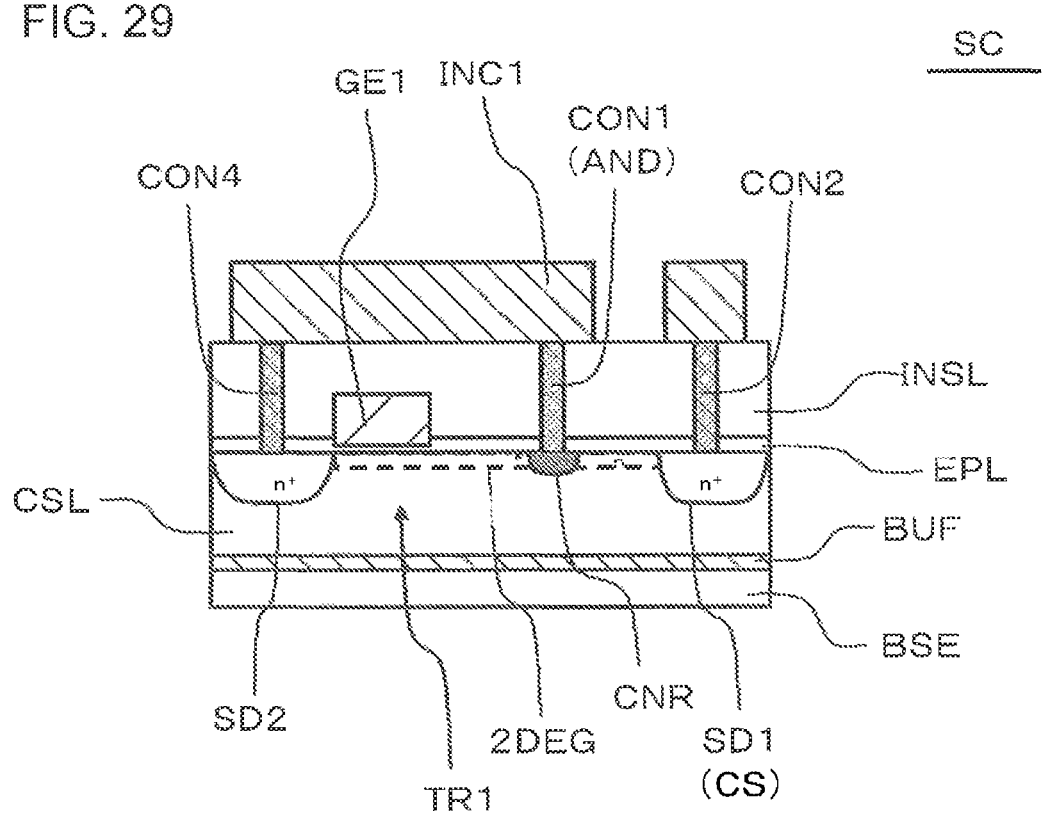
FIG. 29 is a cross-sectional view illustrating a configuration of a semiconductor device according to a twelfth embodiment.

FIG. 29 is a cross-sectional view illustrating a configuration of a semiconductor device SC according to a twelfth embodiment. The semiconductor device SC according to the embodiment has the same configuration as that of the semiconductor device SC according to the eleventh embodiment, except for the following point.

First, an electron supply layer EPL is formed on the nitride semiconductor layer CSL (device layer). The electron supply layer EPL is formed of a material having a lattice constant different from that of the nitride semiconductor layer CSL. When the nitride semiconductor layer CSL is formed of GaN, the electron supply layer EPL is, for example, AlGaN. A two-dimensional electron gas 2DEG is formed at the interface with the electron supply layer EPL in the nitride semiconductor layer CSL. The two-dimensional electron gas 2DEG connects the first impurity region SD1 to the first impurity region SD2. That is, the first transistor TR1 according to the embodiment uses the two-dimensional electron gas 2DEG as a current path. For this reason, the first transistor TR1 does not have a gate insulating film.

The junction region CNR is formed in a portion located between the gate electrode GE1 and the first impurity region SD1 in the surface layer of the nitride semiconductor layer CSL. Meanwhile, in the example shown in the drawing, the junction region CNR is deeper than the layer in which the two dimensional electron gas 2DEG is formed.

In addition, a region in which the gate electrode GE1 is formed in the electron supply layer EPL is thinner than other regions of the electron supply layer EPL. Thereby, the threshold voltage of the first transistor TR1 increases. However, the region in which the gate electrode GE1 is formed in the electron supply layer EPL may also have the same thickness as those of other regions.

When Expression (1) shown in the seventh embodiment is applied to the structure of the embodiment, the two-dimensional electron gas 2DEG corresponds to the first low-concentration impurity region LDD1. Therefore, the surface peak concentration of the two-dimensional electron gas 2DEG is equivalent to $N_{LDD}$, and the depth of the two-dimensional electron gas 2DEG is equivalent to $\sigma_{LDD}$.

Meanwhile, the polarity of a portion overlapping the gate electrode GE1, when seen in a plan view, in the electron supply layer EPL may be set to be reverse to that of the junction region CNR. In this manner, the threshold voltage of the first transistor TR1 also increases.

In the embodiment, it is also possible to obtain the same effect as that in the eleventh embodiment.

Thirteenth Embodiment

Figure 30:
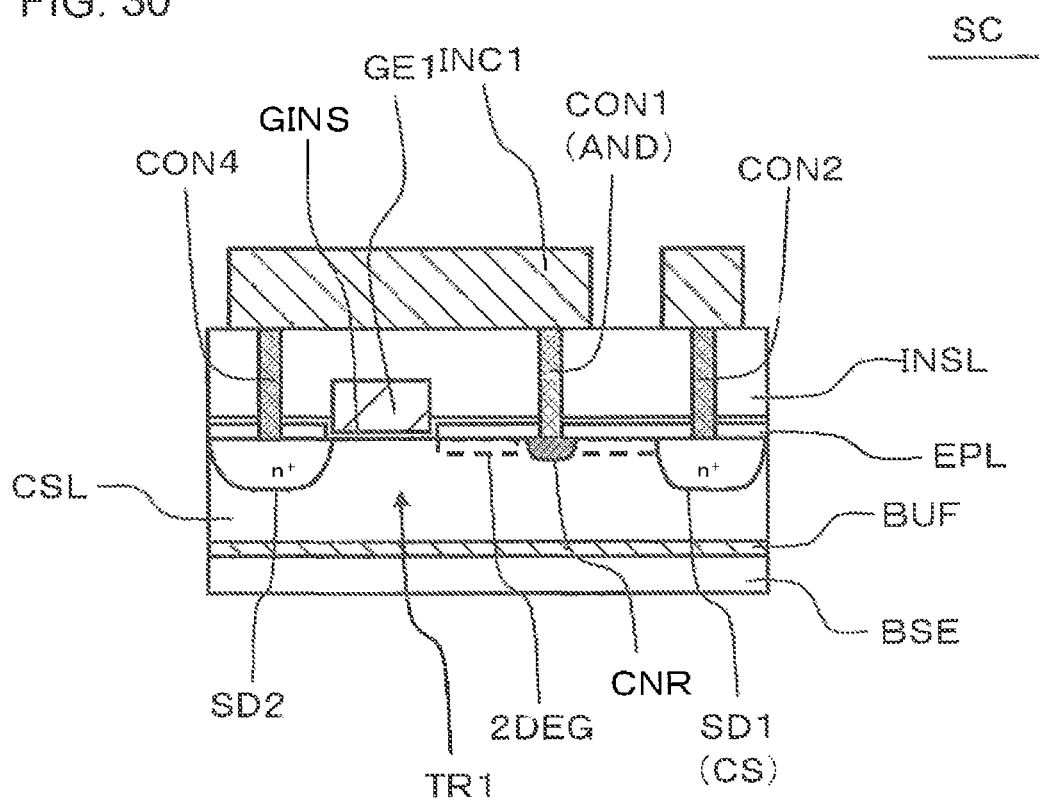
FIG. 30 is a cross-sectional view illustrating a configuration of a semiconductor device according to a thirteenth embodiment.

FIG. 30 is a cross-sectional view illustrating a configuration of a semiconductor device SC according to a thirteenth embodiment. The semiconductor device SC according to the embodiment has the same configuration as that of the semiconductor device SC according to the twelfth embodiment, except for the following point.

First, the electron supply layer EPL is not formed in a region overlapping the gate electrode GE1 when seen in a plan view. Instead, the insulating interlayer INSL is formed in the region overlapping the gate electrode GE1, when seen in a plan view, in the upper portion of the nitride semiconductor layer CSL.

Specifically, the electron supply layer EPL has an opening in a region in which the gate electrode GE1 is formed. The gate insulating film GINS is formed on the nitride semiconductor layer CSL located within the opening and on the electron supply layer EPL, by a deposition method. For this reason, the semiconductor device SC according to the embodiment becomes a normally-off type.

In the embodiment, it is also possible to obtain the same effect as that in the twelfth embodiment. In addition, since the electron supply layer EPL is not formed below the gate electrode GE1, it is possible to reduce a gate leakage current, and to increase the threshold voltage of the first transistor TR1.

Fourteenth Embodiment

Figure 31A:
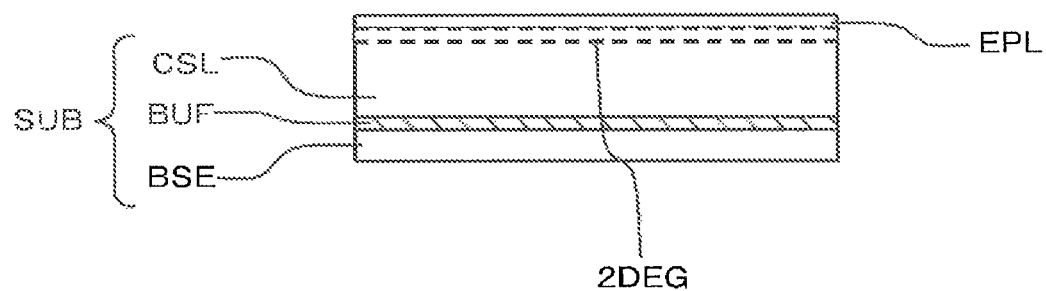
FIGS. 31A and 31B are cross-sectional views illustrating a method for manufacturing a semiconductor device according to a fourteenth embodiment.

FIGS. 31A and 31B to FIGS. 33A and 33B are cross-sectional views illustrating a method for manufacturing a semiconductor device SC according to a fourteenth embodiment. First, as shown in FIG. 31A, the substrate SUB is prepared. Next, the electron supply layer EPL is epitaxially grown on the nitride semiconductor layer CSL (device layer) of the substrate SUB. Thereby, the two-dimensional electron gas 2DEG is formed in the surface layer of the nitride semiconductor layer CSL.

Figure 31B:
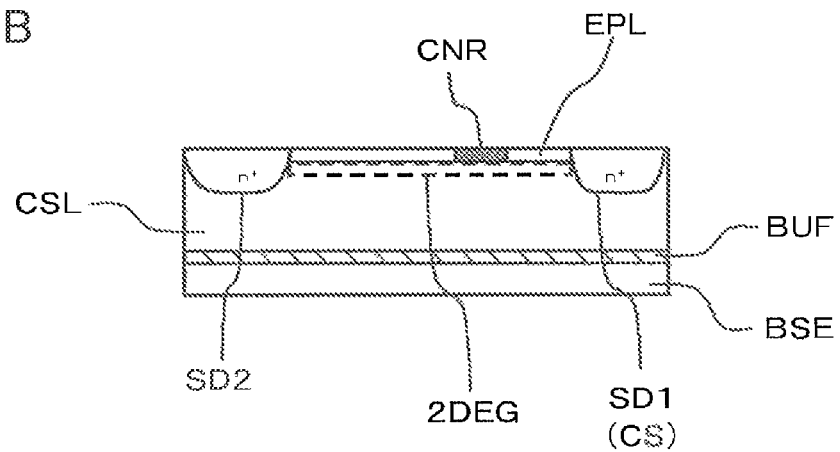

Next, as shown in FIG. 31B, impurities are implanted into the nitride semiconductor layer CSL and the electron supply layer EPL, and the first impurity region SD1 and the first impurity region SD2 are formed. Further, impurities are implanted into the electron supply layer EPL, and the junction region CNR is formed.

Figure 32A:
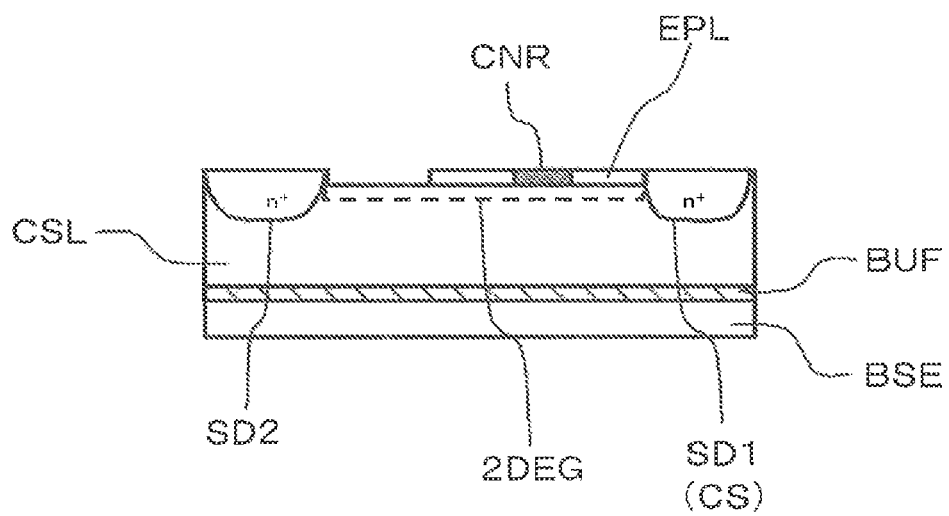
FIGS. 32A and 32B are cross-sectional views illustrating the method for manufacturing the semiconductor device according to the fourteenth embodiment.

Next, as shown in FIG. 32A, the portion located in the region in which the gate electrode GE1 is formed in the electron supply layer EPL is removed. Thereby, an opening is formed in the electron supply layer EPL. The nitride semiconductor layer CSL is exposed at the bottom of the opening.

Figure 32B:
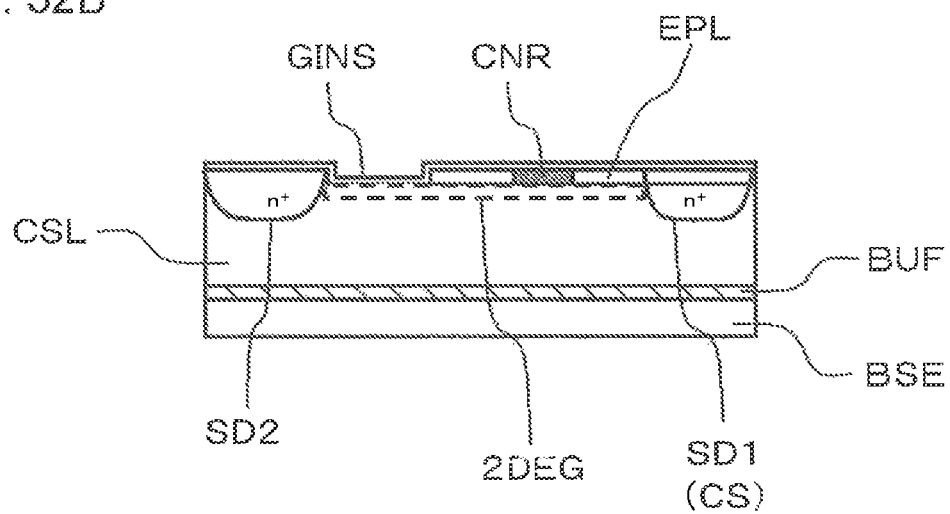

Next, as shown in FIG. 32B, the gate insulating film GINS is formed on the electron supply layer EPL and on the nitride semiconductor layer CSL located within the opening of the electron supply layer EPL, by a deposition method.

Figure 33A:
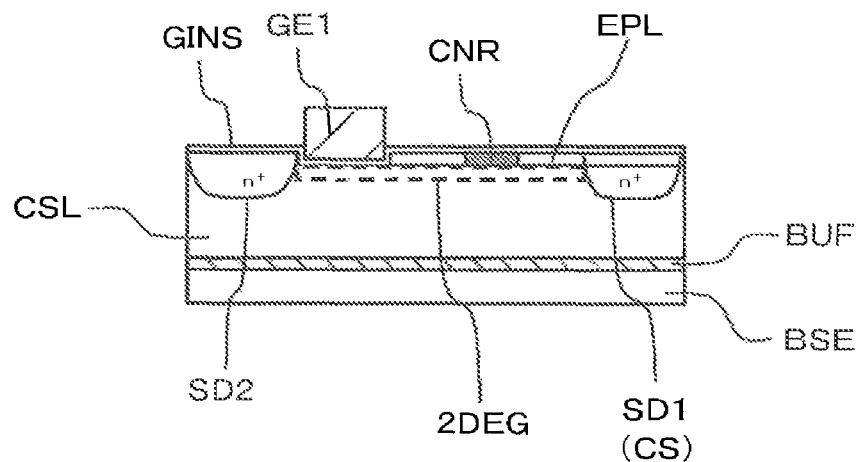
FIGS. 33A and 33B are cross-sectional views illustrating the method for manufacturing the semiconductor device according to the fourteenth embodiment.

Next, as shown in FIG. 33A, a conductive film serving as the gate electrode GE1 is formed on the gate insulating film GINS, and the conductive film is selectively removed. Thereby, the gate electrode GE1 is formed in a portion located within the opening of the electron supply layer EPL in the gate insulating film GINS.

Figure 33B:
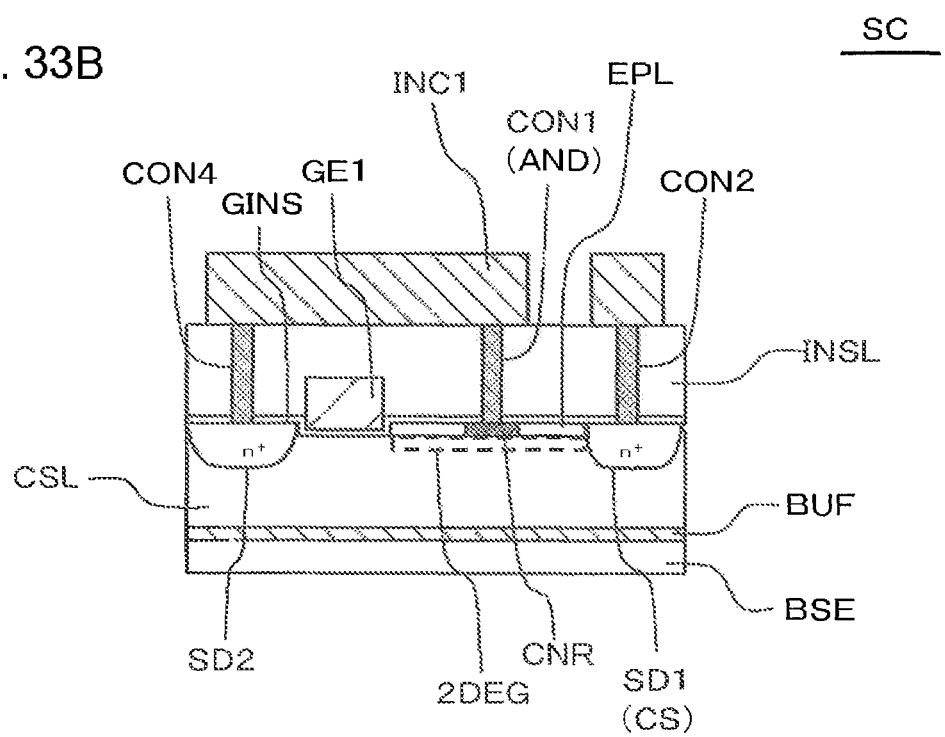

Next, as shown in FIG. 33B, the insulating interlayer INSL is formed on the gate insulating film GINS and the gate electrode GE1. Next, the first contact CON1, the second contact CON2, and the contact CON4 are embedded in the insulating interlayer INSL. Meanwhile, since the junction region CNR is formed in the electron supply layer EPL, the second contact CON2 does not pass through the electron supply layer EPL. Next, the interconnect INC1 is formed on the insulating interlayer INSL.

In the embodiment, it is also possible to obtain the same effect as that in the thirteenth embodiment. In addition, since the junction region CNR is formed in the electron supply layer EPL, it is possible to suppress a decrease in the carrier mobility in the two-dimensional electron gas 2DEG by the junction region CNR.

Figure 40:
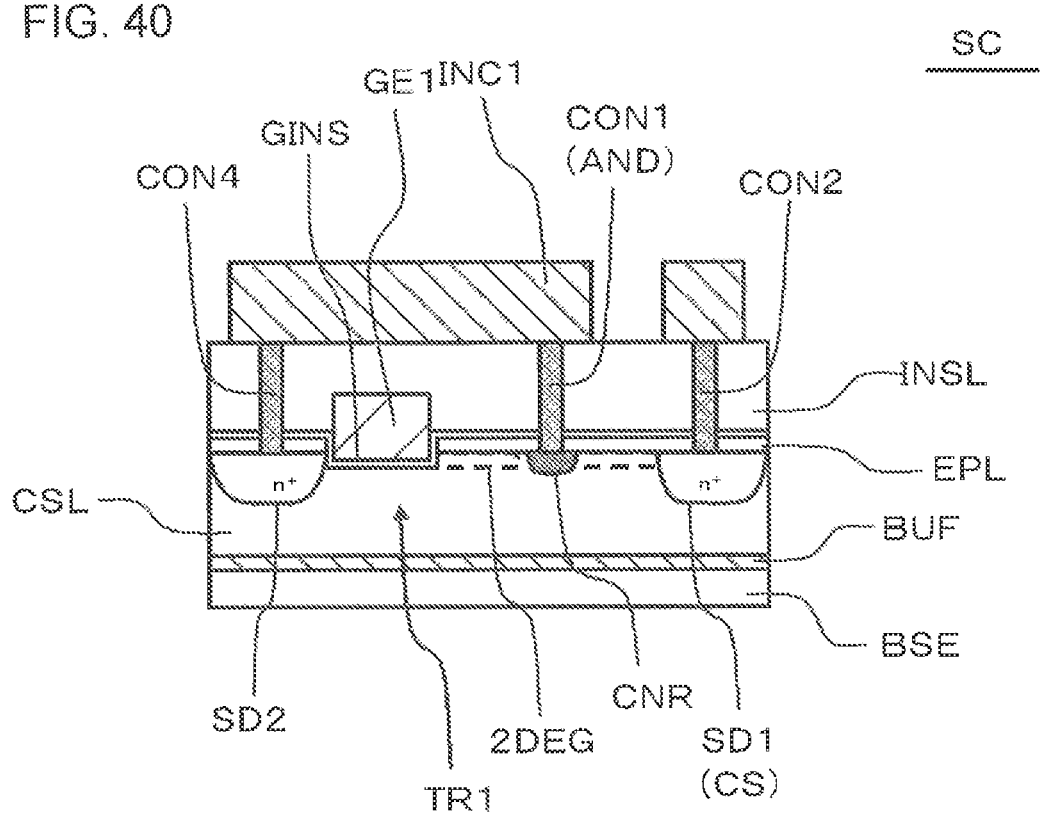
FIG. 40 is a cross-sectional view illustrating a modified example of the semiconductor device according to the fourteenth embodiment.

Meanwhile, as shown in FIG. 40, the gate insulating film GINS may gain entrance to the surface layer of the nitride semiconductor layer CSL. In this case, the two-dimensional electron gas 2DEG is disconnected by the gate insulating film GINS. Meanwhile, in the example shown in FIG. 40, a space may be present between the first impurity region SD2 and the gate electrode GE1. In this case, the two-dimensional electron gas 2DEG is also formed in the surface layer of the nitride semiconductor layer CSL located in the space.

Fifteenth Embodiment

Figure 34:
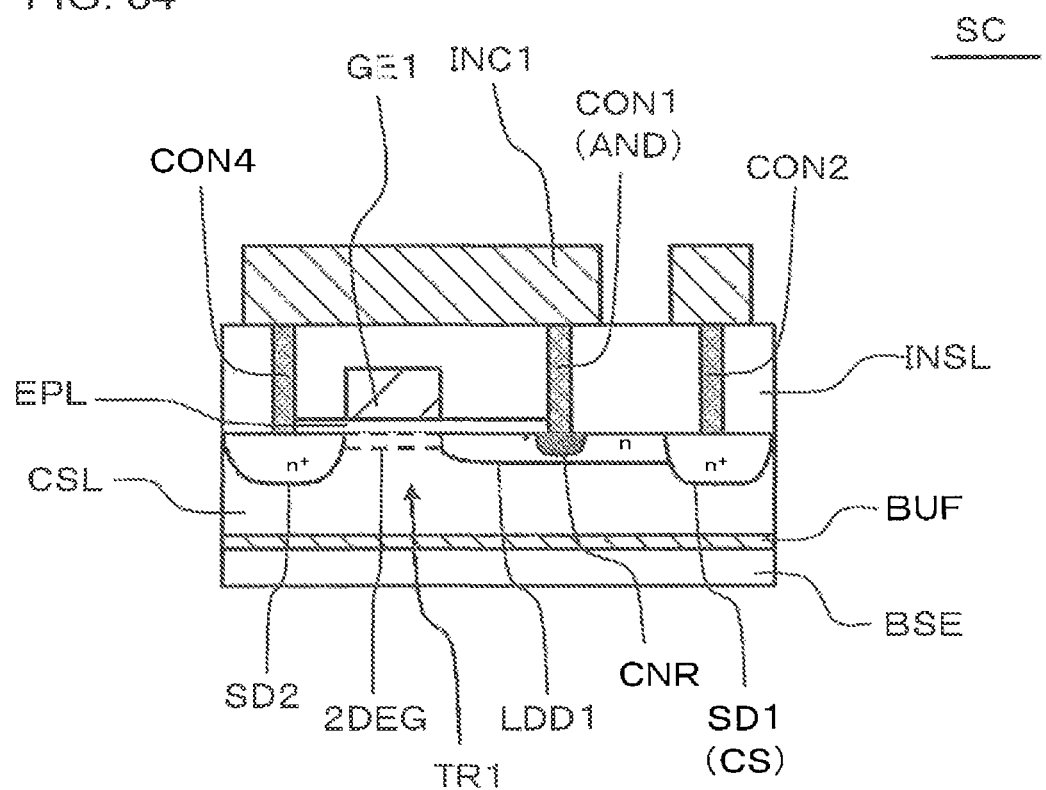
FIG. 34 is a cross-sectional view illustrating a configuration of a semiconductor device according to a fifteenth embodiment.

FIG. 34 is a cross-sectional view illustrating a configuration of a semiconductor device SC according to a fifteenth embodiment. The semiconductor device SC according to the embodiment has the same configuration as that of the semiconductor device SC according to the eleventh embodiment, except that the electron supply layer EPL is included instead of the gate insulating film GINS.

Specifically, the electron supply layer EPL is formed in a region located between the first impurity region SD2 and the first low-concentration impurity region LDD1 in the upper portion of the nitride semiconductor layer CSL. The gate electrode GE1 is formed on the electron supply layer EPL.

In the embodiment, it is also possible to obtain the same effect as that in the eleventh embodiment. In addition, since the two-dimensional electron gas 2DEG is formed in a channel region, it is possible to reduce the channel resistance of the first transistor TR1.

Sixteenth Embodiment

Figure 35:
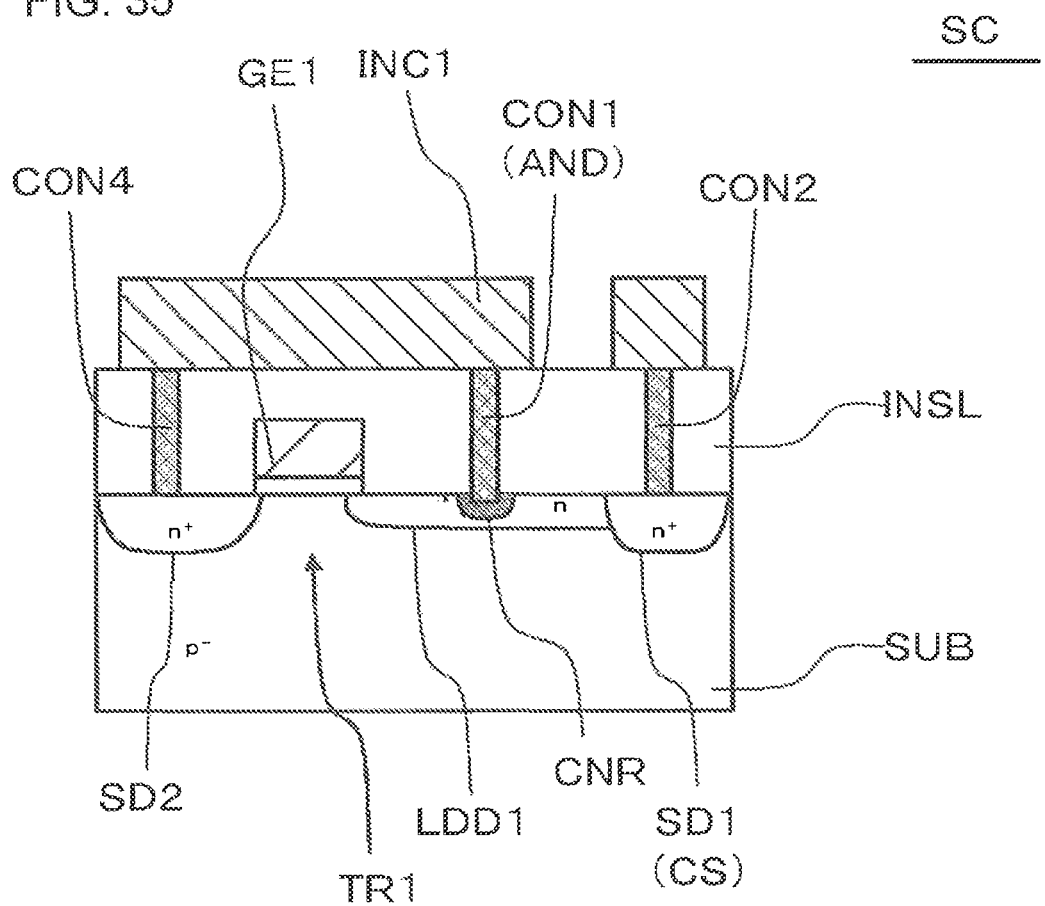
FIG. 35 is a cross-sectional view illustrating a configuration of a semiconductor device according to a sixteenth embodiment.

FIG. 35 is a cross-sectional view illustrating a configuration of a semiconductor device SC according to a sixteenth embodiment. The semiconductor device SC according to the embodiment has the same configuration as that of the semiconductor device SC according to the seventh embodiment, except that the leading end of the first contact CON1 gains entrance to a region in which the junction region CNR is formed in the first low-concentration impurity region LDD1.

In the embodiment, it is also possible to obtain the same effect as that in the seventh embodiment. In addition, since the leading end of the first contact CON1 gains entrance to the junction region CNR, the contact area between the first contact CON1 and the junction region CNR increases. For this reason, it is possible to reduce the contact resistance therebetween.

Seventeenth Embodiment

Figure 41:
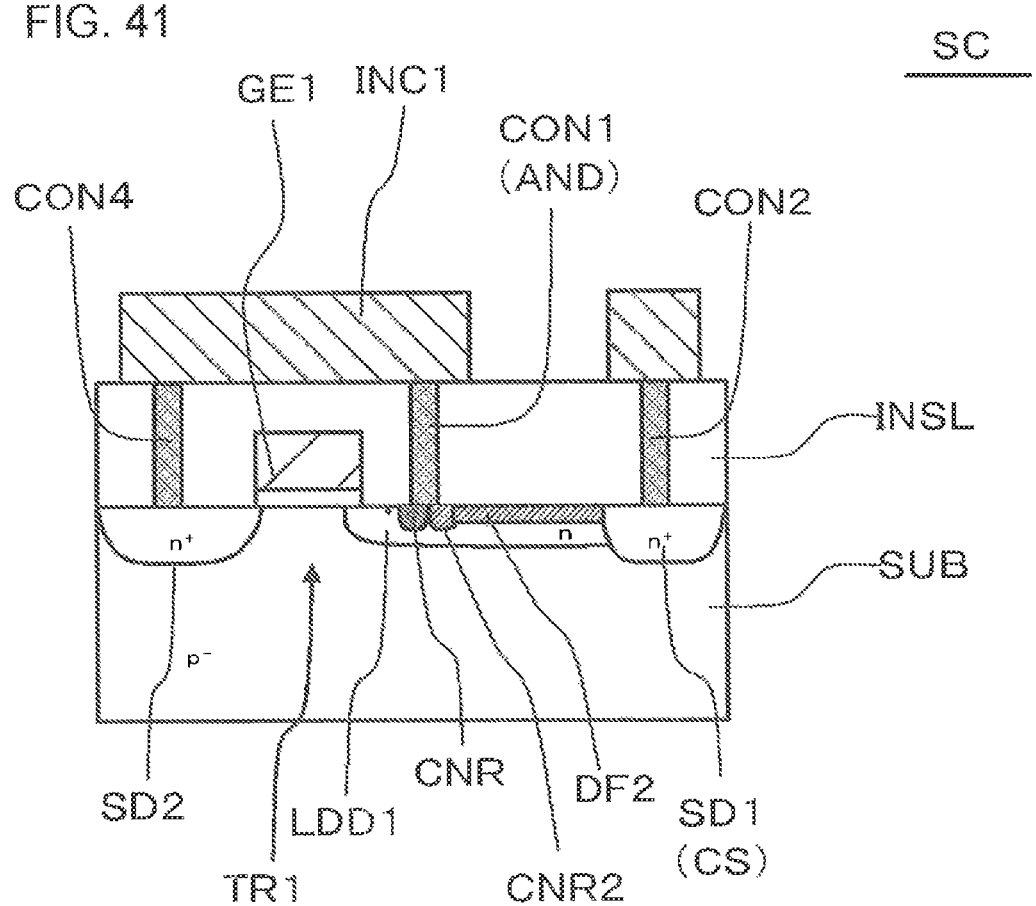
FIG. 41 is a cross-sectional view illustrating a configuration of a semiconductor device according to a seventeenth embodiment.

FIG. 41 is a cross-sectional view illustrating a configuration of a semiconductor device SC according to a seventeenth embodiment. The semiconductor device SC according to the embodiment has the same configuration as those of any of the seventh to sixteenth embodiments, except that a second junction region CNR2 and a second conductivity type region DF2 are included. Meanwhile, in the example shown in the drawing, the same case as that in the seventh embodiment is shown.

The second junction region CNR2 is a second conductivity type impurity region, and is formed in the first low-concentration impurity region LDD1. The second junction region CNR2 is located between the junction region CNR (first junction region) and the first impurity region SD1 serving as a drain, when seen in a plan view. The second conductivity type region DF2 is a second conductivity type impurity region, and is formed in the surface layer of the first low-concentration impurity region LDD1. The second conductivity type region DF2 is located between the second junction region CNR2 and the first impurity region SD1 serving as a drain, when seen in a plan view, and is connected to the second junction region CNR2. For this reason, a potential applied to the interconnect INC1 is transmitted to the second conductivity type region DF2 through the first contact CON1 and the second junction region CNR2.

Meanwhile, the second junction region CNR2 preferably has a higher impurity concentration than that of the second conductivity type region DF2. However, the second junction region CNR2 may be a portion of a region of the second conductivity type region DF2. In this case, the second conductivity type region DF2 and the second junction region CNR2 are formed integrally with each other. The first contact CON1 is connected to a portion of the second conductivity type region DF2.

In the embodiment, it is also possible to obtain the same effect as those in any of the seventh to sixteenth embodiments. In addition, the second conductivity type region DF2 is located between the first impurity region SD1 and the junction region CNR. For this reason, it is possible to further increase a withstanding voltage between the first impurity region SD1 serving as a drain and the gate electrode GE1. Particularly, in the embodiment, a source potential is applied to the second junction region CNR2 through the interconnect INC1. For this reason, since the potential of the second conductivity type region DF2 is stabilized by the source potential, it is possible to further increase the withstanding voltage between the first impurity region SD1 and the gate electrode GE1.

In addition, a potential is applied to the second conductivity type region DF2 using the first contact CON1. For this reason, it is not necessary to newly provide a contact for applying a fixed potential to the second conductivity type region DF2. Therefore, it is possible to suppress an increase in the size of the semiconductor device SC.

Eighteenth Embodiment

Figure 36:
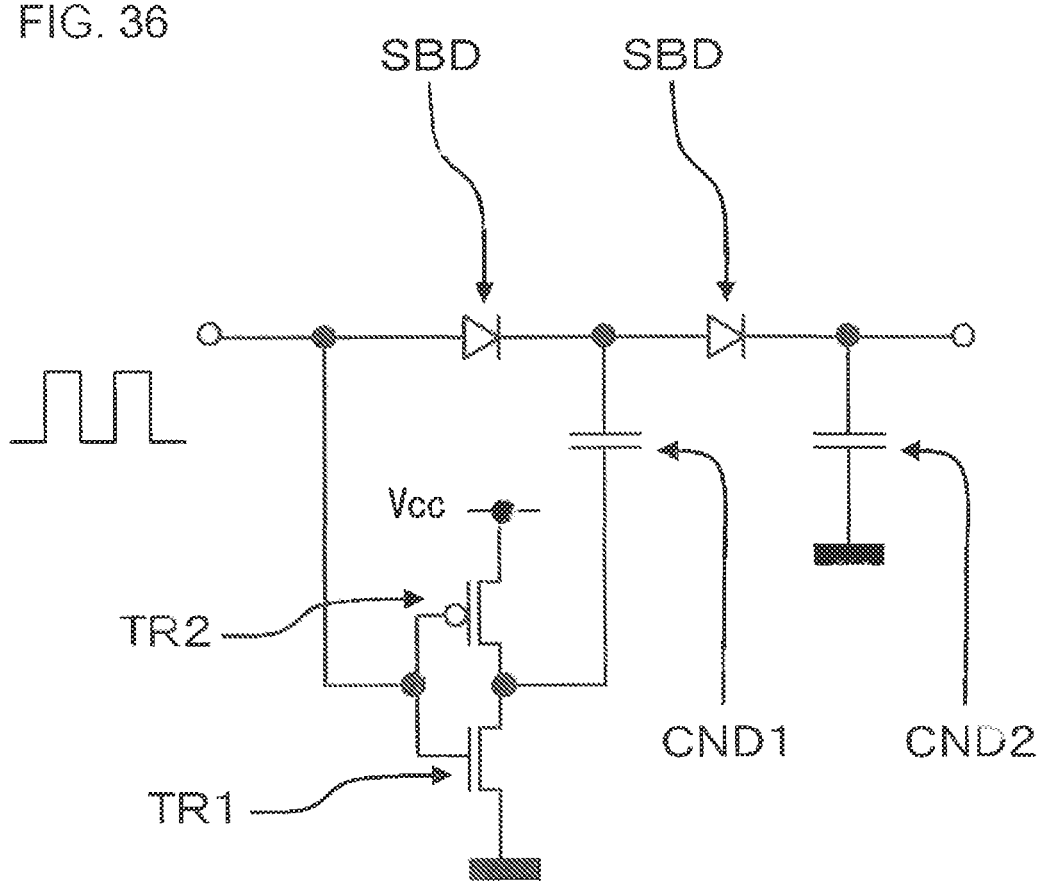
FIG. 36 is a diagram illustrating a circuit included in a semiconductor device according to an eighteenth embodiment.

FIG. 36 is a diagram illustrating a circuit included in a semiconductor device SC according to an eighteenth embodiment. The circuit shown in the drawing is a charge pump circuit. Specifically, two Schottky barrier diodes SBD are connected in series to each other in the same direction, a second low-concentration impurity region AND of the Schottky barrier diode SBD on the upstream side is connected to a gate electrode GE1 of a first transistor TR1 and a gate electrode GE2 of a second transistor TR2. In addition, a second impurity region CS of the Schottky barrier diode SBD on the upstream side is connected to a source of the second transistor TR2 and a drain of the first transistor TR1 through a capacitive element CND1. The second impurity region CS of the Schottky barrier diode SBD on the downstream side is grounded through a capacitive element CND2. In addition, a drain of the second transistor TR2 is connected to a power supply interconnect Vcc, and a source of the first transistor TR1 is grounded.

Figure 37:
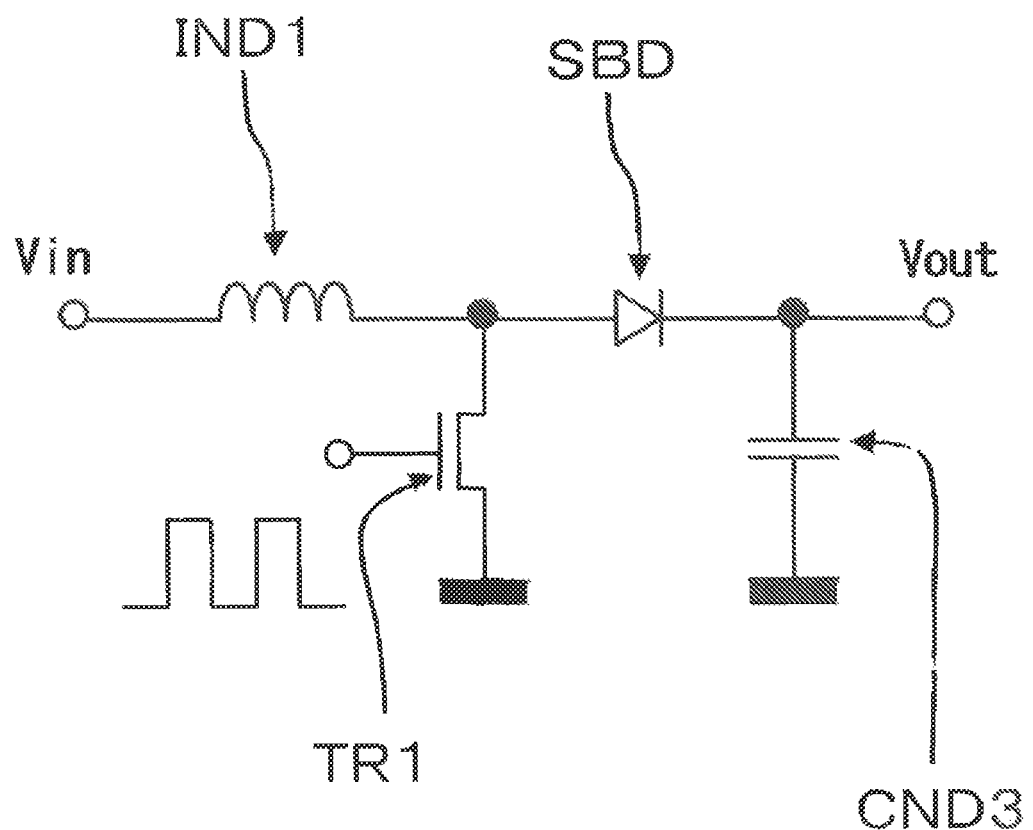
FIG. 37 is a diagram illustrating a circuit included in a semiconductor device according to a nineteenth embodiment.

In the embodiment, the Schottky barrier diode SBD has the same configuration as those of any of the first to seventeenth embodiments. For this reason, in the embodiment, it is also possible to obtain the same effect as those in any of the first to seventeenth embodiments Nineteenth Embodiment FIG. 37 is a diagram illustrating a circuit included in a semiconductor device SC according to a nineteenth embodiment. The circuit shown in the drawing is a DC-to-DC converter circuit. Specifically, a Schottky barrier diode SBD is connected to an input terminal of the DC-to-DC converter circuit through a inductor IND1. A first impurity region SD1 of a first transistor TR1 is connected between the inductor IND1 and the Schottky barrier diode SBD, and a first impurity region SD2 of the first transistor TR1 is grounded. In addition, an output terminal of the Schottky barrier diode SBD is connected to an output terminal of the DC-to-DC converter circuit. The output terminal and the Schottky barrier diode SBD are installed with a capacitive element CND3 interposed therebetween.

In the embodiment, the Schottky barrier diode SBD has the same configuration as those of any of the first to seventeenth embodiments. For this reason, in the embodiment, it is also possible to obtain the same effect as those in any of the first to seventeenth embodiments.

Twentieth Embodiment

Figure 38:
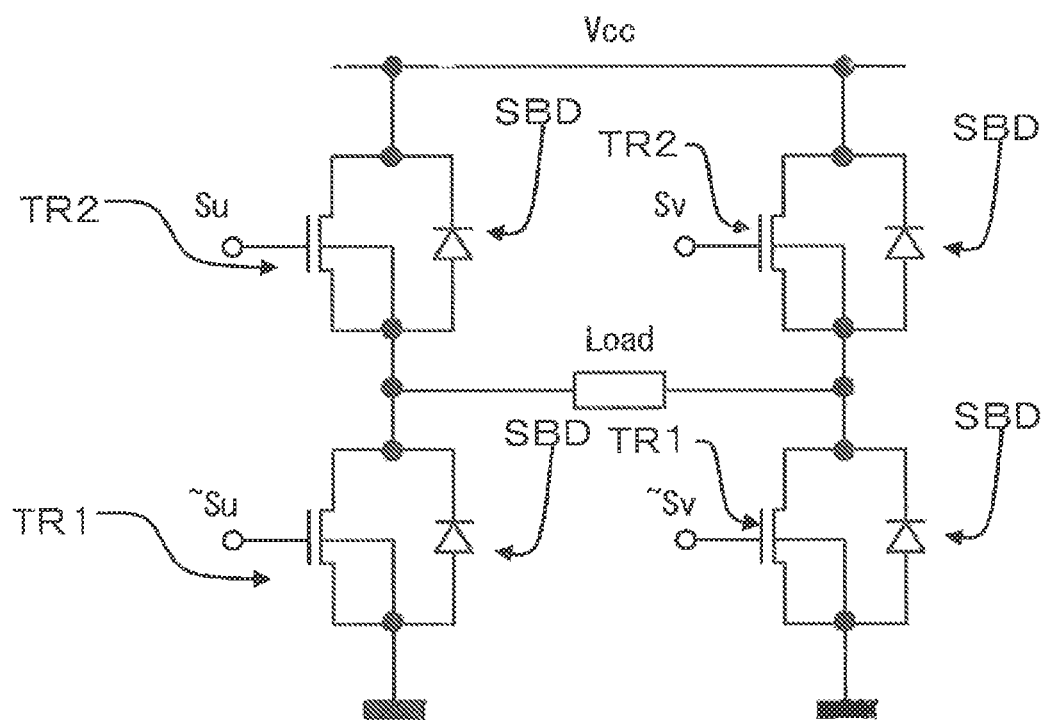
FIG. 38 is a diagram illustrating a circuit included in a semiconductor device according to a twentieth embodiment.

FIG. 38 is a diagram illustrating a circuit included in a semiconductor device SC according to a twentieth embodiment. In the circuit shown in the drawing is a single-layer inverter circuit used as a DC-to-AC converter circuit. This circuit includes two first transistors TR1 and two second transistors TR2. Schottky barrier diodes SBD are connected parallel to the first transistors TR1 and the second transistors TR2 in the reverse direction.

In the embodiment, the Schottky barrier diode SBD has the same configuration as those of any of the first to seventeenth embodiments. For this reason, in the embodiment, it is also possible to obtain the same effect as those in any of the first to seventeenth embodiments.

Twenty-First Embodiment

Figure 39:
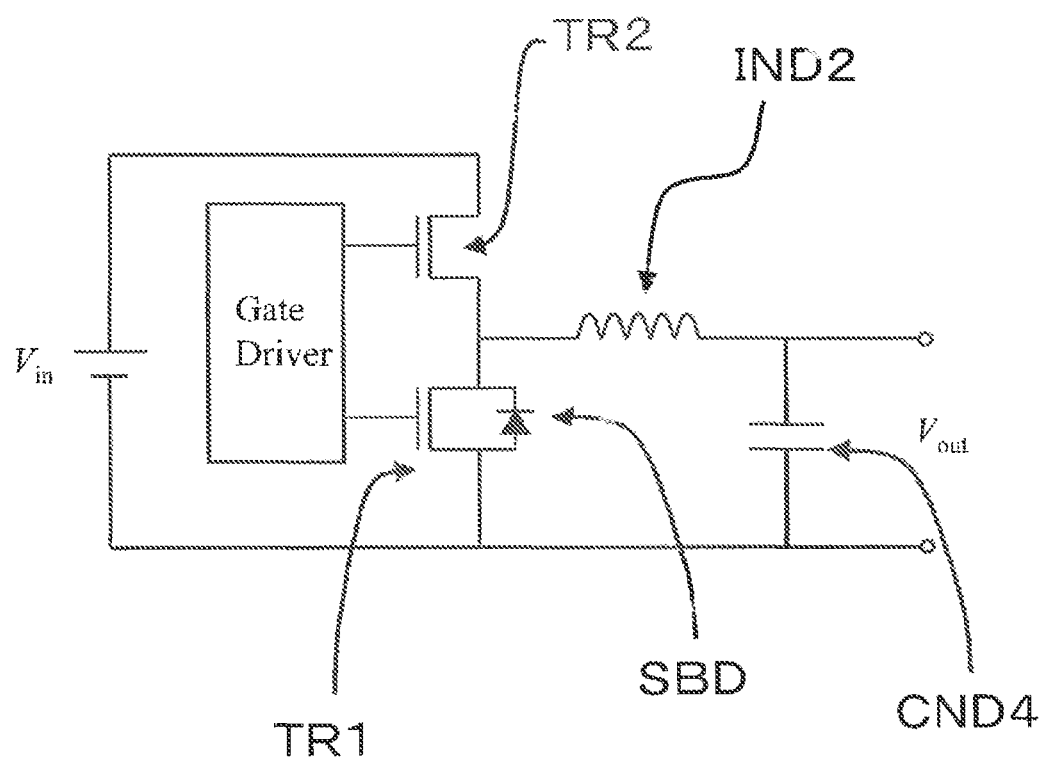
FIG. 39 is a diagram illustrating a circuit included in a semiconductor device according to a twenty-first embodiment.

FIG. 39 is a diagram illustrating a circuit included in a semiconductor device SC according to a twenty-first embodiment. In the circuit shown in the drawing is a switching regulator, and is configured such that a second transistor TR2 and a first transistor TR1 are connected in series to each other with respect to a power supply. A Schottky barrier diode SBD is connected parallel to the first transistor TR1 in the reverse direction. Meanwhile, an output terminal of the switching regulator is connected to connection portions of the second transistor TR2 and the first transistor TR1 through an inductor IND2. In addition, a capacitive element CND4 is connected between the output terminal and a ground terminal of the switching regulator.

In the embodiment, the Schottky barrier diode SBD has the same configuration as those of any of the first to seventeenth embodiments. For this reason, in the embodiment, it is also possible to obtain the same effect as those in any of the first to seventeenth embodiments.

It is apparent that the present invention is not limited to the above embodiments, and may be modified and changed without departing from the scope and spirit of the invention.

What is claimed is:

1. A semiconductor device comprising:
   a substrate;
   a first impurity region of a first conductivity type, formed in the substrate, which serves as a source and a drain of a transistor;
   a first low-concentration impurity region of a first conductivity type, formed in the substrate, which serves as an LDD region of the transistor;
   a second impurity region of a first conductivity type, formed in the substrate, which has the same impurity concentration as that of the first impurity region;
   a second low-concentration impurity region of a first conductivity type, formed in the substrate, which is connected to the second impurity region and has the same impurity concentration as that of the first low-concentration impurity region;
a first contact which is connected to the second impurity region; and
a second contact which is connected to the second low-concentration impurity region,
wherein an element isolation film is not formed between the first contact and the second contact when seen in a plan view.

2. The semiconductor device according to claim 1, further comprising:
a first silicide layer which is formed in a surface layer of the first impurity region; and
a second silicide layer which is formed in a surface layer of the second impurity region,
wherein the first contact is connected to the second silicide layer.

3. The semiconductor device according to claim 2, wherein the first silicide layer and the second silicide layer are silicides made of the same metal as each other.

4. The semiconductor device according to claim 2, further comprising:
a third silicide layer which is formed in a portion of a surface layer of the second low-concentration impurity region,
wherein the second contact is connected to the third silicide layer.

5. The semiconductor device according to claim 1, further comprising:
a barrier metal layer that covers a bottom and a lateral side of the second contact,
wherein the second contact is connected to the second low-concentration impurity region through the barrier metal layer.

6. The semiconductor device according to claim 1, wherein a leading end of the second contact gains entrance to a portion in which the second low-concentration impurity region is formed in the substrate.

7. The semiconductor device according to claim 6, wherein a region overlapping the leading end of the second contact in a depth direction in the second low-concentration impurity region has a decreasing impurity concentration as the depth thereof increases.

8. The semiconductor device according to claim 7, wherein the leading end of the second contact is rounded.

9. The semiconductor device according to claim 1, wherein the second impurity region serves as the first impurity region.

10. A semiconductor device comprising:
a substrate;
a gate electrode which is formed over the substrate;
a source region, formed in the substrate, which is a first conductivity type impurity region;
a drain region, formed in the substrate, which is the first conductivity type impurity region;
a low-concentration impurity region of the first conductivity type, formed in the substrate, which is located between the gate electrode and the drain region when seen in a plan view and has a lower carrier concentration than that of the drain region;
a first contact which is connected to the low-concentration impurity region, and is electrically connected to the source region; and
a first junction region of a first conductivity type, formed in a portion connected to the first contact in the low-concentration impurity region, which has a higher carrier concentration than that of the low-concentration impurity region and has a lower carrier concentration than that of the drain region.

11. A semiconductor device comprising:
a substrate;
a gate electrode which is formed over the substrate;
a source region, formed in the substrate, which is a first conductivity type impurity region;
a drain region, formed in the substrate, which is the first conductivity type impurity region;
a low-concentration impurity region of the first conductivity type, formed in the substrate, which is located between the gate electrode and the drain region when seen in a plan view and has a lower carrier concentration than that of the drain region;
a first contact which is connected to the low-concentration impurity region, and is electrically connected to the source region; and
a first junction region which is formed by introducing an impurity into a portion connected to the first contact in the substrate,
wherein when a impurity concentration of the first junction region is set to $N_d$, a depth of the first junction region is set to $\sigma_d$, the impurity concentration of the low-concentration impurity region is set to $N_{LDD}$, and the depth of the low-concentration impurity region is set to $\sigma_{LDD}$, the following Expression (1) is satisfied:

$$N_d > N_{LDD} \cdot \sigma_{LDD}^2 / \sigma_d^2 \qquad (1).$$

12. The semiconductor device according to claim 11, wherein the impurity concentration is a peak concentration when an impurity concentration distribution in a depth direction is approximated by a Gaussian distribution, and the depth of the impurity region is dispersion when the impurity concentration distribution in a depth direction is approximated by a Gaussian distribution.

13. The semiconductor device according to claim 10, wherein the first junction region is shallower than the low-concentration impurity region.

14. The semiconductor device according to claim 10, wherein the first junction region is deeper than the low-concentration impurity region.

15. The semiconductor device according to claim 10, wherein a leading end of the first contact gains entrance to a portion in which the low-concentration impurity region is formed in the substrate.

16. The semiconductor device according to claim 10, wherein the substrate includes a nitride semiconductor layer,
the source region, the drain region, and the low-concentration impurity region are formed in the nitride semiconductor layer,
the semiconductor device further comprises an electron supply layer which is formed over a portion located between the source region and the drain region in the nitride semiconductor layer, and
the gate electrode is formed over the electron supply layer.

17. The semiconductor device according to claim 10, further comprising:
a second junction region of a second conductivity type, formed in the low-concentration impurity region, which is located between the first junction region and the drain region when seen in a plan view; and
a second conductivity type region, formed in a surface layer of the low-concentration impurity region, which is located between the second junction region and the drain region when seen in a plan view and is connected to the second junction region, wherein the first contact is connected to the second junction region.

18. A semiconductor device comprising:
a nitride semiconductor layer;
a gate electrode which is formed over the nitride semiconductor layer;
a source region which is formed in the nitride semiconductor layer;
a drain region which is formed in the nitride semiconductor layer;
a junction region, formed in the nitride semiconductor layer, which is located between the gate electrode and the drain region when seen in a plan view, and into which an impurity is introduced; and
a first contact which is located over the junction region, and is electrically connected to the source region.

19. The semiconductor device according to claim 18, wherein the nitride semiconductor layer includes:
a device layer in which the source region and the drain region are formed; and
an electron supply layer which is formed over the device layer,
wherein the junction region is formed in the device layer.

20. The semiconductor device according to claim 18, wherein the nitride semiconductor layer includes:
a device layer in which the source region and the drain region are formed; and
an electron supply layer which is formed over the device layer,
wherein the junction region is formed in the electron supply layer.

* * * * *